United States Patent
Yu

(10) Patent No.: US 8,921,850 B2
(45) Date of Patent: Dec. 30, 2014

(54) OXIDE THIN FILM TRANSISTOR, METHOD FOR FABRICATING TFT, ARRAY SUBSTRATE FOR DISPLAY DEVICE AND METHOD FOR FABRICATING THE SAME

(71) Applicant: LG Display Co., Ltd., Seoul (KR)

(72) Inventor: SangHee Yu, Gyeonggi-do (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 13/728,732

(22) Filed: Dec. 27, 2012

(65) Prior Publication Data
US 2013/0313546 A1 Nov. 28, 2013

(30) Foreign Application Priority Data
May 24, 2012 (KR) .................. 10-2012-0055683

(51) Int. Cl.
*H01L 29/786* (2006.01)
*H01L 27/15* (2006.01)
*H01L 29/66* (2006.01)
*H01L 29/417* (2006.01)
*H01L 29/423* (2006.01)

(52) U.S. Cl.
CPC ...... *H01L 29/7869* (2013.01); *H01L 29/66969* (2013.01); *H01L 27/153* (2013.01); *H01L 29/41733* (2013.01); *H01L 29/42384* (2013.01); *H01L 29/66742* (2013.01); *H01L 29/78606* (2013.01)

USPC ................. 257/43; 257/59; 257/72; 257/347; 257/E21.414; 257/E27.121; 257/E29.003; 257/E29.005; 257/E29.296; 349/42; 438/129; 438/158

(58) Field of Classification Search
USPC ........ 257/43, 59, 72, 347, E21.414, E27.121, 257/E29.003, E29.005, E29.296; 349/42; 438/129, 159
See application file for complete search history.

(56) References Cited

U.S. PATENT DOCUMENTS

| | | | |
|---|---|---|---|
| 6,025,605 A * | 2/2000 | Lyu .................................. | 257/59 |
| 6,049,365 A * | 4/2000 | Nakashima ..................... | 349/42 |
| 6,218,221 B1* | 4/2001 | Sah .............................. | 438/158 |
| 2008/0001154 A1* | 1/2008 | Lee ................................. | 257/59 |
| 2008/0006825 A1* | 1/2008 | Choi et al. ..................... | 257/59 |
| 2010/0123138 A1* | 5/2010 | Choi et al. ..................... | 257/72 |

* cited by examiner

*Primary Examiner* — Dao H Nguyen
(74) *Attorney, Agent, or Firm* — Fenwick & West LLP

(57) ABSTRACT

A thin film transistor (TFT), a method for fabricating a TFT, an array substrate for a display device having a TFT, and a method for fabricating the same are provided. An oxide thin film transistor (TFT) includes: a gate electrode formed on a substrate; a gate insulating layer formed on the gate electrode; an active layer formed on the gate insulating layer above the gate electrode; an etch stop layer pattern formed on the active layer; a source alignment element and a drain alignment element formed on the etch stop layer pattern and spaced apart from one another; and a source electrode in contact with the source alignment element and the active layer and a drain electrode in contact with the drain alignment element and the active layer.

22 Claims, 16 Drawing Sheets

OXIDE THIN FILM TRANSISTOR, METHOD FOR FABRICATING TFT, ARRAY SUBSTRATE FOR DISPLAY DEVICE AND METHOD FOR FABRICATING THE SAME

CROSS-REFERENCE TO RELATED APPLICATIONS

The present disclosure relates to subject matter contained in priority Korean Application No. 10-2012-0055683, filed on May 24, 2012, which is herein expressly incorporated by reference in its entirety.

BACKGROUND

1. Field of the Invention

The present invention relates to a thin film transistor (TFT) and, more particularly, to a TFT, a method for fabricating a TFT, an array substrate for a display device having a TFT, and a method for fabricating the same.

2. Description of the Related Art

Television products are the major application targets in the remarkably growing flat panel display market. Currently, a liquid crystal display (LCD) is a mainstream as a TV panel, and research into an application of an organic light emitting display device to TVs has been actively ongoing.

Current TV display techniques are focused on major items required in the market, and the requirements in the market include a large-scale TV or digital information display (DID), low cost, high picture quality (video representation performance, high resolution, brightness, contrast ratio, color gamut, and the like).

In order to meet the requirements, a thin film transistor (TFT) that may be applied as a switching and driving element of a display having excellent performance without increasing cost, together with an increase in the size of a substrate such as glass, or the like, is required.

Thus, development of techniques in the future is expected to be focused on securing a TFT fabrication technique capable of fabricating a display panel having excellent performance at low cost according to such tendency.

An amorphous silicon TFT (a-Si TFT) as a typical driving and switching element of a display is a currently commonly used element that may be uniformly formed on a large substrate having a size exceeding 2 m at low cost.

However, as displays tend to have a large size and high picture quality, high device performance is required, and thus, it is determined that an existing a-Si TFT having mobility of 0.5 $cm^2$/Vs has reached a limitation.

Thus, a high performance TFT having mobility higher than that of a-Si TFT and a fabrication technique thereof are required. Also, a-Si TFT has a problem of reliability in that as it continues to operate, device characteristics continue to be degraded to result in a failure of maintaining initial performance.

This is the reason why the a-Si TFT is hardly applied to an organic luminescence emitted diode (OLED) that operates while a current is continuously applied, in comparison to an LCD driven by an AC.

A polycrystalline silicon TFT having remarkably high performance relative to an a-Si TFT has high mobility ranging from tens to hundreds of $cm^2$/Vs, so it has performance applicable to a display having high picture quality hardly realized by the existing a-Si TFT and rarely degrades device characteristics according to an operation in comparison to the a-Si TFT. However, a fabrication of a poly-Si TFT requires a large number of processes in comparison to the a-Si TFT and investment in additional equipment should be made first.

Thus, p-Si TFT may be appropriately applied to make a display have high picture quality or applied to a product such as an OLED, or the like, but it is inferior to the existing a-Si TFT in terms of cost, so an application thereof is limited.

In particular, in the case of a p-Si TFT, due to a technical issue such as a limitation in fabrication equipment or a defect in uniformity, a fabrication process using a large substrate having a size of 1 m has not been realized so far, so the difficulty of the p-Si TFT in its application to a TV product is a factor making it difficult for high performance p-Si TFT to be easily settled down in the market.

Thus, demand for a new TFT technique that may support the advantages (large size, low cost, and uniformity) of the a-Si TFT and the advantages (high performance and reliability) is highly on the rise, and research into the new TFT technique has been actively ongoing. An oxide semiconductor is a typical one thereof.

An oxide semiconductor has advantages in that it has high mobility in comparison to an a-Si TFT and simpler fabrication process and lower fabrication cost in comparison to a polycrystalline silicon (p-Si) TFT, and thus, it is of a high utility value in an LCD or an OLED.

In this point of view, a structure of an oxide TFT according to the related art using an oxide semiconductor will be described with reference to FIGS. 1 to 3.

FIG. 1 is a plan view of an oxide TFT structure according to the related art.

FIG. 2 is a schematic sectional view of the oxide TFT according to the related art, taken along line II-II in FIG. 1.

FIG. 3 is an enlarged sectional view of a portion 'A' in FIG. 2, illustrating a distance between an etch stop layer pattern and source electrode and drain electrode.

As illustrated in FIGS. 1 to 3, the oxide TFT 10 according to the related art includes a patterned gate electrode 13 formed on a substrate 11 and having a certain width and length, a gate insulating layer 15 formed on the entire surface of the substrate 11 including the gate electrode, an active layer 17 formed on an upper portion of the gate insulating layer 15 including an upper side of the gate electrode 13 and made of an oxide semiconductor patterned to have a certain shape, an etch stop layer 19 formed on the active layer 17 and patterned to have a certain shape, and a source electrode 21 and a drain electrode 23 spaced apart from one another on an upper portion of the etch stop layer 19 and formed on upper portions of the active layer 17 and the gate insulating layer 15.

Here, the etch stop layer 19 overlaps with the gate electrode 13 and the active layer 17, and is formed on an upper portion of a channel region of the active layer 17.

Also, the source electrode 21 and the drain electrode 23 are formed to be spaced apart on an upper portion of the etch stop layer 19 and formed on the etch stop layer 19, the active layer 17, and the gate insulating layer 15.

In this case, a first width W1 in which the source electrode 21 and one side of the etch stop layer 19 overlaps is different from a second width W2 in which the drain electrode 23 and the other side the etch stop layer 19 overlaps.

Namely, as shown in FIGS. 1 and 3, the first width W1 in which the source electrode 21 and one side of the etch stop layer 19 overlaps and the second width W2 in which the drain electrode 23 and the other side the etch stop layer 19 overlaps are different due to misalignment of a mask during a process of fabricating the source electrode and the drain electrode of the oxide TFT. Here, the first width W1 is longer than the second width W2. This is caused as the mask (not shown) is shifted to the other side of the etch stop layer 19 when the source electrode and the drain electrode are formed.

In particular, when the oxide TFT is fabricated, a process of forming the etch stop layer 19 and a process forming the source electrode 21 and the drain electrode 23 are performed through different masking processes, so there is a possibility in which the source electrode 21 and the drain electrode 23 and the etch stop layer 19 are misaligned.

Thus, in the case of the oxide TFT according to the related art, an ON current of the oxide TFT or a threshold voltage Vth is shifted due to the misalignment caused between the source electrode 21 and the drain electrode 23 and the etch stop layer 19.

In addition, in the oxide TFT according to the related art, since the process of forming the etch stop layer 19 and the process of forming the source electrode 21 and the drain electrode 23 are performed in different masking processes, the number of masking processes is increased to increase fabrication costs.

SUMMARY OF THE INVENTION

An aspect of the present invention provides an oxide thin film transistor (TFT) capable of enhancing element uniformity characteristics by preventing misalignment in fabricating a semiconductor element, and reducing fabrication cost by reducing the number of masks, a method for fabricating the same, an array substrate for a display device having the same, and a method for fabricating the same.

According to an aspect of the present invention, there is provided an oxide thin film transistor (TFT) including: a gate electrode formed on a substrate; a gate insulating layer formed on the gate electrode; an active layer formed on the gate insulating layer above the gate electrode; an etch stop layer formed on the active layer; a source alignment element and a drain alignment element formed on the etch stop layer pattern such that the source alignment element is spaced apart from the drain alignment element; a source electrode in contact with the source alignment element and the active layer; and a drain electrode in contact with the drain alignment element and the active layer.

According to another aspect of the present invention, there is provided a method for fabricating an oxide thin film transistor (TFT), including: forming a gate electrode on a substrate; forming a gate insulating layer on the gate electrode; forming an etch stop layer pattern, a source alignment element and a drain alignment element, wherein the etch stop layer pattern is located on the active layer, the source alignment element and drain alignment element are located on the etch stop layer pattern, and the source alignment element is spaced apart from the drain alignment element; forming a source electrode in contact with the source alignment element and the active layer; and forming a drain electrode in contact with the drain alignment element and the active layer.

According to another aspect of the present invention, there is provided an array substrate for a display device having thin film transistors (TFTs), including: a gate electrode formed on a substrate; a gate insulating layer formed on the gate electrode; an active layer formed on the gate insulating layer above the gate electrode; an etch stop layer formed on the active layer; a source alignment element and a drain alignment element formed on the etch stop layer such that the source alignment element is spaced apart from the drain alignment element; a passivation layer formed on the source alignment element and the drain alignment element and having a source electrode contact hole and a drain electrode contact hole exposing the active layer; a source electrode formed on the passivation layer and disposed to be in contact with the source alignment element and the active layer through the source electrode contact hole and a drain electrode formed on the passivation layer and disposed to be in contact with the drain alignment element and the active layer through the drain electrode contact hole; a pixel electrode formed on the passivation layer and extending from the drain electrode; and a common electrode formed on the passivation layer and spaced apart from the pixel electrode.

According to another aspect of the present invention, there is provided a method for forming an array substrate for a display device having thin film transistors (TFTs), including: forming a gate electrode on a substrate; forming a gate insulating layer on the gate electrode; forming an active layer on the gate insulating layer above the gate electrode; forming an etch stop layer pattern, a source alignment element and a drain alignment element, wherein the etch stop layer pattern is located on the active layer, the source alignment element and drain alignment element are located on the etch stop layer pattern, and the source alignment element is spaced apart from the drain alignment element; forming a passivation layer on the source alignment element and the drain alignment element such that the passiviation layer has a source electrode contact hole and a drain electrode contact hole exposing the active layer; and forming a source electrode in contact with the source alignment element and the active layer through the source electrode contact hole and a drain electrode in contact with the drain alignment element and the active layer through the drain electrode contact hole; and forming a pixel electrode extending from the drain electrode and a common electrode spaced apart from the pixel electrode.

According to another aspect of the present invention, there is provided an array substrate for a display device having thin film transistors (TFTs), the array substrate comprising: a gate electrode formed on a substrate; a gate insulating layer formed on the gate electrode; an active layer formed on the gate insulating layer above the gate electrode; an etch stop layer pattern formed on the active layer; a source alignment element and a drain alignment element formed on the etch stop layer pattern, wherein the source alignment element is spaced apart from the drain alignment element; a source electrode in contact with the source alignment element and the active layer; a drain electrode in contact with the drain alignment element and the active layer; and a pixel electrode extending from the drain electrode.

According to another aspect of the present invention, there is provided a method for forming an array substrate for a display device having thin film transistors (TFTs), including: forming a gate electrode on a substrate; forming a gate insulating layer on the gate electrode; forming an active layer on the gate insulating layer above the gate electrode; forming an etch stop layer pattern, a source alignment element and a drain alignment element, wherein the etch stop layer pattern is located on the active layer, the source alignment element and drain alignment element are located on the etch stop layer pattern, and the source alignment element is spaced apart from the drain alignment element; forming a source electrode in contact with the source alignment element and the active layer; forming a drain electrode in contact with the drain alignment element and the active layer; and forming a pixel electrode extending from the drain electrode.

The oxide TFT, the method for fabricating the oxide TFT, the array substrate for a display device having the same, and the method for fabricating the same according to embodiments of the present invention have the following advantages.

In the case of the oxide TFT, the method for fabricating the oxide TFT, the array substrate for a display device having the same, and the method for fabricating the same according to embodiments of the present invention, in forming a source alignment element, a drain alignment element, and an etch stop layer using a half-tone mask, misalignment of the source alignment element and the drain alignment element and the etch stop layer can be eliminated.

In the case of the oxide TFT, the method for fabricating the oxide TFT, the array substrate for a display device having the same, and the method for fabricating the same according to embodiments of the present invention, since the source alignment element and the drain alignment element and the etch stop layer are simultaneously formed in a common masking process/masketing step by using a half-tone mask, an alignment margin between the source alignment element and the drain alignment element and the etch stop layer is reduced, implementing a short channel.

In the case of the oxide TFT, the method for fabricating the oxide TFT, the array substrate for a display device having the same, and the method for fabricating the same according to embodiments of the present invention, since the source alignment element and the drain alignment element and the etch stop layer are simultaneously formed by using a half-tone mask, photo misalignment is eliminated, improving a difference in element characteristics due to a change in a process and element uniformity characteristics in a substrate.

In addition, in the case of the oxide TFT, the method for fabricating the oxide TFT, the array substrate for a display device having the same, and the method for fabricating the same according to embodiments of the present invention, since the source alignment element, the drain alignment element, and the etch stop layer are simultaneously formed in a common mask process by using a half-tone mask, the number of masks can be reduced to reduce fabrication cost.

The foregoing and other objects, features, aspects and advantages of the present invention will become more apparent from the following detailed description of the present invention when taken in conjunction with the accompanying drawings.

DETAILED DESCRIPTION OF THE INVENTION

An oxide thin film transistor (TFT) structure according to embodiments of the present invention will be described in detail with reference to the accompanying drawings.

Figure 1:
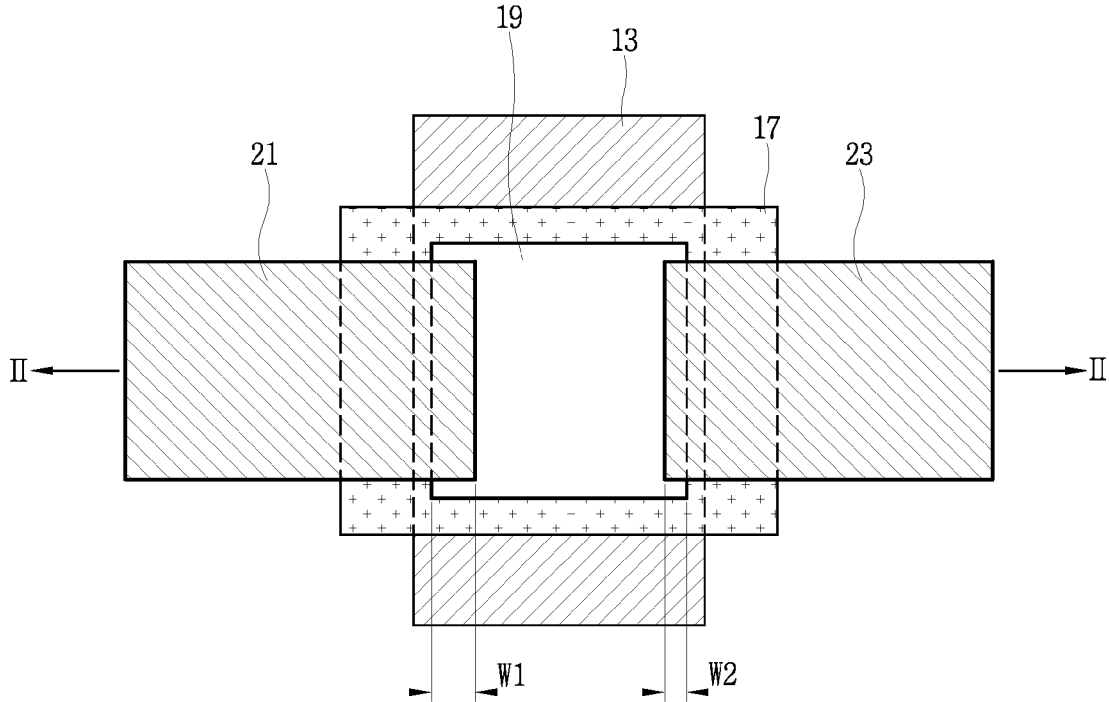
FIG. 1 is a plan view illustrating an oxide thin film transistor (TFT) structure according to the related art.
Figure 2:
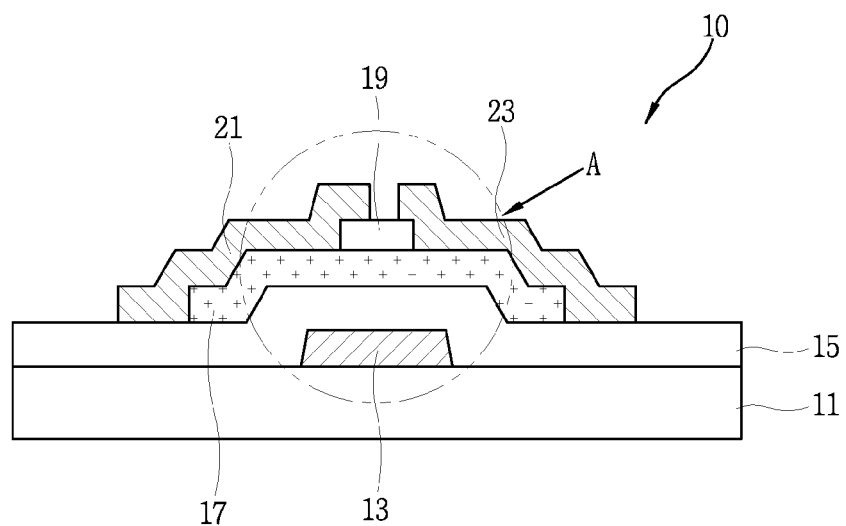
FIG. 2 is a schematic sectional view of the oxide TFT according to the related art, taken along line II-II in FIG. 1.
Figure 3:
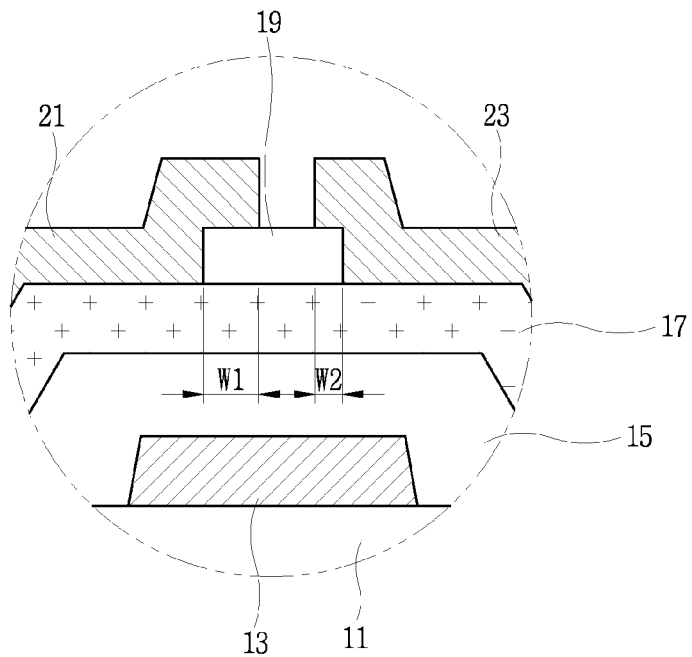
FIG. 3 is an enlarged sectional view of a portion 'A' in FIG. 2, illustrating a distance between an etch stop layer pattern and source electrode and drain electrode.
Figure 4:
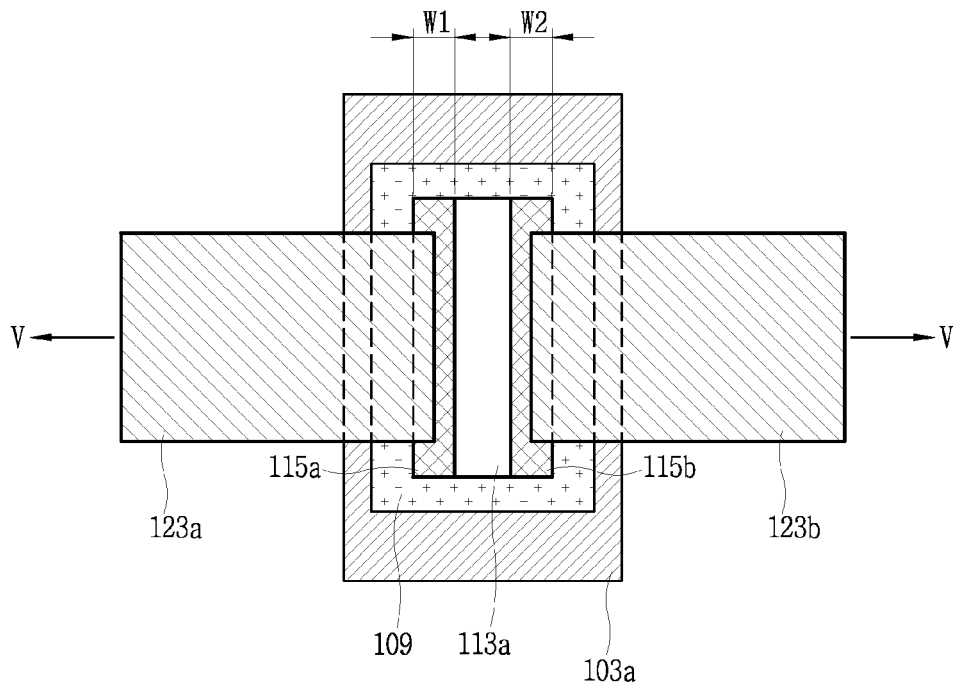
FIG. 4 is a plan view of an oxide TFT structure according to an embodiment of the present invention.

FIG. 4 is a plan view of an oxide TFT structure according to an embodiment of the present invention.

Figure 5:
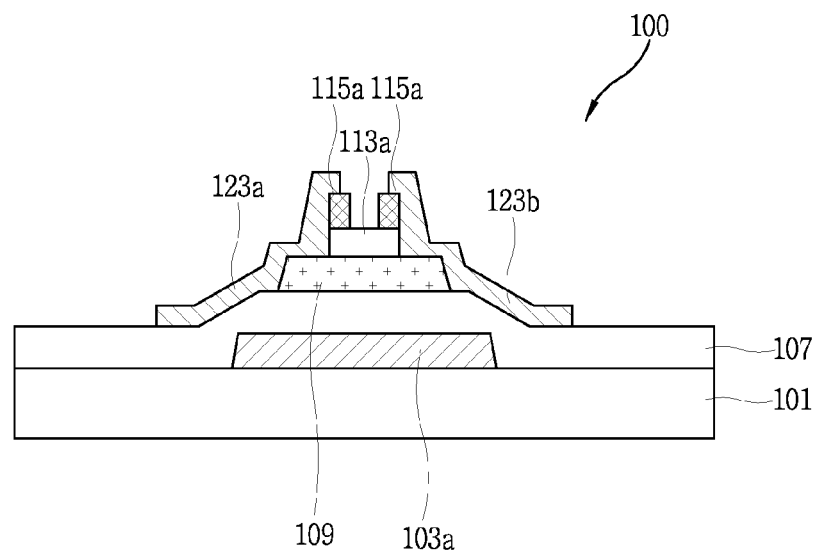
FIG. 5 is a schematic sectional view of the oxide TFT according to an embodiment of the present invention, taken along line V-V in FIG. 4.

FIG. 5 is a schematic sectional view of the oxide TFT according to an embodiment of the present invention, taken along line V-V in FIG. 4.

As illustrated in FIGS. 4 and 5, an oxide TFT 100 according to an embodiment of the present invention includes a gate electrode 103a formed on a substrate 101; a gate insulating layer 107 formed on the entire surface of the substrate 101 including the gate electrode 103a; an active layer 109 formed on the gate insulating layer 107 above the gate electrode 103a; an etch stop layer pattern 113a formed on the active layer 109; a source alignment element 115a and a drain alignment element 115b formed on the etch stop layer pattern 113a and spaced apart from one another; and a source electrode 123a in contact with the source alignment element 115a and the active layer 109 and a drain electrode 123b in contact with the drain alignment element 115b and the active layer 109.

Here, the gate electrode 103a may be made of silicon, glass, plastic, or any other appropriate material, or may be made of a metal or any other appropriate conductive material. For example, the gate electrode 103a may be made of an oxide selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide ($In_2O_3$), a combination of two or more of them, or any other appropriate material(s). Also, a material used to form the gate electrode 103a may include a metal selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Also, the gate insulating layer 107 may be made of a material selected from the group consisting of silicon oxide ($SiO_2$), silicon nitride (SiNx), zirconium oxide ($ZrO_2$), hafnium oxide ($HfO_2$), titanium oxide ($TiO_2$), tantalum oxide ($Ta_2O_5$), a barium-strontium-titanium-oxygen compound (Ba—Sr—Ti—O), and a bismuth-zinc-niobium-oxygen compound (Bi—Zn—Nb—O), a combination of two or more of them, or any other appropriate material.

The active layer 109, a layer serving to form a channel allowing electrons to move therein between the source electrode 123a and the drain electrode 123b, is made of an oxide semiconductor including silicon (Si) instead of a low temperature polysilicon (LTPS) or an amorphous silicon (a-Si) material.

In this case, the oxide semiconductor may be obtained by adding silicon (Si) to an oxide semiconductor including one or more elements selected from the group consisting of germanium (Ge), tin (Sn), lead (Pb), indium (In), titanium (Ti), gallium (Ga), and aluminum (Al), and zinc (Zn). For example, the active pattern 109a may be made of silicon indium zinc oxide (Si—InZnO (SIZO)) obtained by adding silicon ions to a composite indium zinc oxide (InZnO).

When the active layer 109 is made of SIZO, a composition ratio of the content of silicon (Si) atoms to the entire content of zinc (Zn), indium (In), and silicon (Si) atoms in the active layer may ranging from about 0.001 wt % to about 30 wt %. As the content of the silicon (Si) atoms is increased, the role of controlling generation of electrons of the active layer 109 is strengthened to potentially lower mobility, but element stability may be better.

Meanwhile, besides the foregoing materials, the active layer 109 may further include a Group I element such as lithium (Li) or potassium (K), a Group II element such as magnesium (Mg), calcium (Ca), or strontium (Sr), a Group III element such as gallium (Ga), aluminum (Al), indium (In), or yttrium (Y), Group IV element such as titanium (Ti), zirconium (Zr), silicon (Si), tin (Sn), or geranium (Ge), a Group V element such as tantalum (Ta), vanadium (V), niobium (Nb), or antimony (Sb), or may further include lanthanides elements such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Also, the etch stop layer pattern 113a may be made of any one selected from inorganic insulating materials including silicon oxide ($SiO_2$) and silicon nitride (SiNx).

Also, the source alignment element 115a and the drain alignment element 115b may be made of a metal or any other conductive material, like the gate electrode 103a. For example, the source alignment element 115a and the drain alignment element 115b may be made of an oxide selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide ($In_2O_3$), a combination of two or more of them, or any other appropriate material(s). Also, a material used to form the gate electrode 103a may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

In particular, the source alignment element 115a and the drain alignment element 115b are entirely formed within the region of the etch stop layer pattern 113a. The source alignment element 115a and the drain alignment element 115b are formed to be spaced apart from one another by a gap. This is possible because the source alignment element 115a and the drain alignment element 115b are simultaneously formed with the etch stop layer pattern 113a during a single common masking process using a half-tone mask in fabricating the oxide TFT.

Thus, since the first width W1 of one side of the etch stop layer pattern 113a overlapping with the source alignment element 115a and the second width W2 of the other side of the etch stop layer pattern 113a overlapping with the drain alignment element 115b are substantially equal, misalignment between the source alignment element 115a and the drain alignment element 115b and the etch stop layer pattern 113a is prevented, resulting in greater uniformity in threshold voltage across different TFTs.

The source electrode 123a and the drain electrode 123b are made of the same material. The source electrode 123a and the drain electrode 123b may be made of a metal or any other appropriate conductive material, like the gate electrode 103a. For example, the source electrode 123a and the drain electrode 123b may be made of an oxide selected selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide ($In_2O_3$), a combination of two or more of them, or any other appropriate material(s). Also, a material used to form the source electrode 123a and the drain electrode 123b may include a metal selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

In particular, the source electrode 123a and the drain electrode 123b are formed to be in contact with an exposed portion of the active layer 109 as well as upper portions of the source alignment element 115a and the drain alignment element 115b, whereby a channel is connected with the source electrode 123a and the drain electrode 123b to exhibit TFT characteristics.

In one embodiment, the oxide TFT 100 is a TFT of a twisted nematic (TN) type LCD panel and the drain electrode 123b extends to be used as a pixel electrode of a pixel of the TN LCD panel. Additionally, the source electrode 123a extends to be used as a data line of the LCD panel.

Meanwhile, a method for fabricating an oxide TFT according to an embodiment of the present invention having the foregoing configuration as described above will be described in detail with reference to the accompanying drawings.

FIGS. 6A to 6J are sectional views illustrating a fabrication process of the oxide TFT according to an embodiment of the present invention.

Figure 6A:
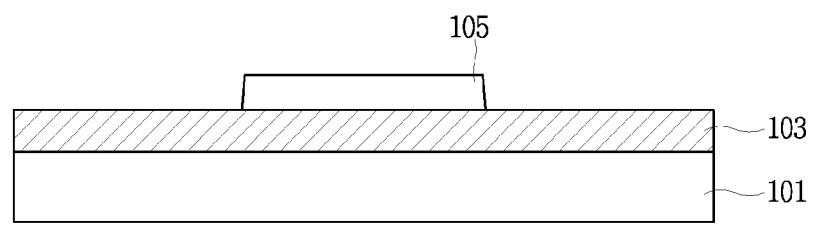
FIGS. 6A to 6J are sectional views illustrating a fabrication process of the oxide TFT according to an embodiment of the present invention.

Referring to FIG. 6A, a first conductive material for a gate electrode is deposited on the substrate 101 through a sputtering method to form a first conductive layer 103, on which a first photosensitive layer (not shown) is coated and patterned through a first masking process using photolithography to form the first photosensitive layer pattern 105.

In this case, the first conductive layer 103 may be made of silicon, glass, plastic, or any other appropriate material, or may be made of a metal or any other appropriate conductive material. For example, the gate electrode 103a may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide ($In_2O_3$), a combination of two or more of them, or any other appropriate material(s). Also, a material used to form the first conductive layer 103 may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Figure 6B:
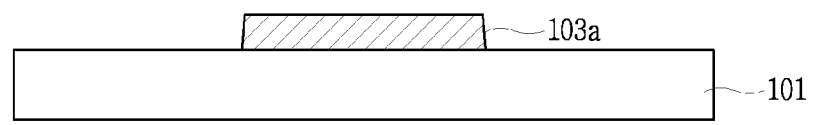

Thereafter, referring to FIG. 6B, the first conductive layer 103 is selectively etched by using the first photosensitive layer pattern 105 as an etch mask to form the gate electrode 103a.

Figure 6C:
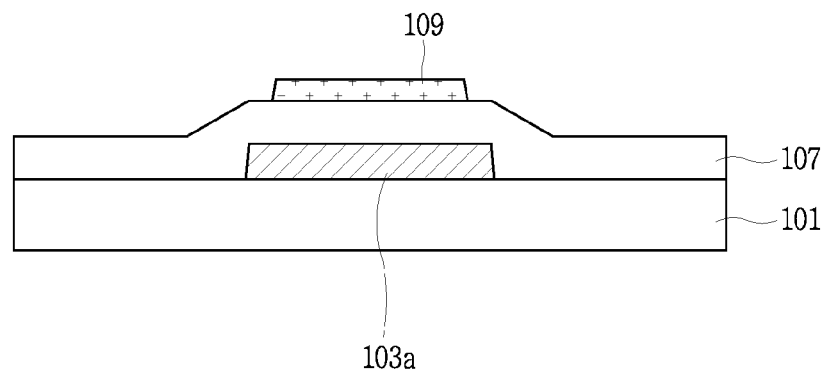

Subsequently, referring to FIG. 6C, the first photosensitive layer pattern 105 is removed, and the gate insulating layer 107 is formed on the entire surface of the substrate including the gate electrode 103a. In this case, the gate insulating layer 107 may be made of any one selected from the group consisting of silicon oxide ($SiO_2$), silicon nitride (SiNx), zirconium oxide ($ZrO_2$), hafnium oxide ($HfO_2$), titanium oxide ($TiO_2$), tantalum oxide ($Ta_2O_5$), a barium-strontium-titanium-oxygen compound (Ba—Sr—Ti—O), and a bismuth-zinc-niobium-oxygen compound (Bi—Zn—Nb—O), a combination of two or more of them, or any other appropriate material.

Subsequently, a semiconductor layer (not shown) is formed by using an oxide semiconductor material on the gate insulating layer 107, and a second photosensitive layer (not shown) is coated thereon.

Thereafter, although not shown, the second photosensitive layer (not shown) is patterned through a second masking process using photolithography to form a second photosensitive layer pattern (not shown).

Subsequently, referring to FIG. 6C, the semiconductor layer (not shown) is selectively removed by using the second photosensitive layer pattern (not shown) as an etch mask to form the active layer 109 on the gate insulating layer 107 above the gate electrode 103a. Here, the active layer 109, serving to form a channel in which electrons move between the source electrode 123a and the drain electrode 123b, is made of an oxide semiconductor including silicon (Si) instead of LTPS or amorphous silicon (a-Si).

Here, the oxide semiconductor may be obtained by adding silicon (Si) to an oxide semiconductor including one or more selected from the group consisting of germanium (Ge), tin (Sn), lead (Pb), indium (In), titanium (Ti), gallium (Ga), and aluminum (Al), and zinc (Zn). For example, the active pattern 109a may be made of silicon indium zinc oxide (Si—InZnO (SIZO)) obtained by adding silicon ions to a composite indium zinc oxide (InZnO).

When the active layer 109 is made of SIZO, a composition ratio of the content of silicon (Si) atoms to the entire content of zinc (Zn), indium (In), and silicon (Si) atoms in the active layer may ranging from about 0.001 wt % to about 30 wt %. As the content of the silicon (Si) atoms is increased, the role of controlling generation of electrons of the active layer 109 is strengthened to potentially lower mobility, but element stability may be better.

Meanwhile, besides the foregoing materials, the active layer 109 may further include a Group I element such as lithium (Li) or potassium (K), a Group II element such as magnesium (Mg), calcium (Ca), or strontium (Sr), a Group III element such as gallium (Ga), aluminum (Al), indium (In), or yttrium (Y), Group IV element such as titanium (Ti), zirconium (Zr), silicon (Si), tin (Sn), or geranium (Ge), a Group V element such as tantalum (Ta), vanadium (V), niobium (Nb), or antimony (Sb), or may further include lanthanides elements such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Figure 6D:
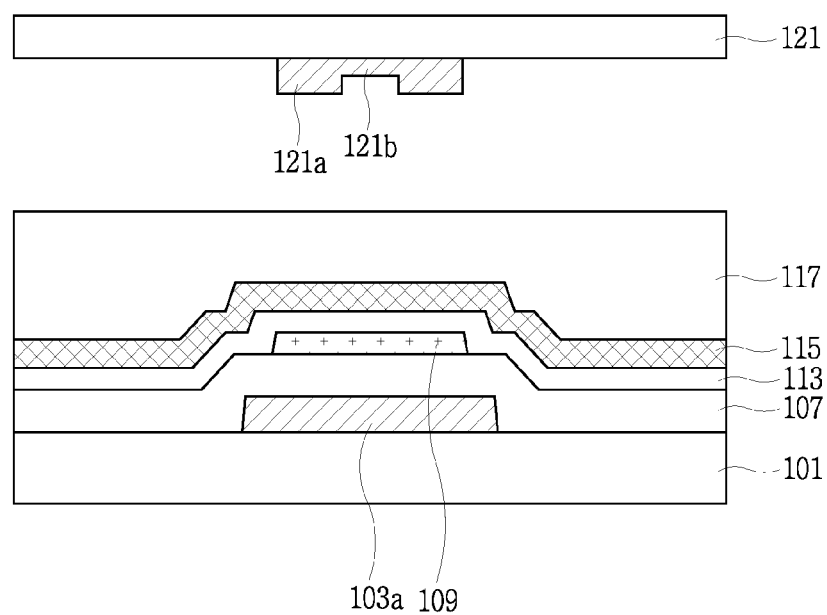

Thereafter, referring to FIG. 6D, etch stop layer 113 and the second conductive layer 115 are sequentially stacked on the entire surface of the substrate including the active layer 109, on which the third photosensitive layer 117 is coated. Here, the etch stop layer 113 may be made of any one selected from inorganic insulating materials including silicon oxide ($SiO_2$) and silicon nitride (SiNx).

Also, like the gate electrode 103a, the second conductive layer 115 may be made of a metal or any other appropriate conductive material. For example, the second conductive layer 115 may be made of any one selected from the group consisting of indium tin oxide (ITO), gallium zinc oxide (GZO), indium gallium zinc oxide (IGZO), indium gallium oxide (IGO), indium zinc oxide (IZO), indium oxide ($In_2O_3$), a combination of two or more of them, or any other appropriate material(s). Also, a material used to form the second conductive layer 115 may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Subsequently, an exposure process is performed through photolithography using a half-tone mask 121. Here, the half-tone mask 121 includes a first light blocking pattern 121a and a second light blocking pattern 121b. The first light blocking pattern 121a serves to block entire light, and the second light blocking pattern 121b serves to allow a portion of light to be transmitted through while blocking the other remaining portion of light. In one embodiment, the first light blocking pattern 121a may be thicker than the second light blocking pattern 121b.

Figure 6E:
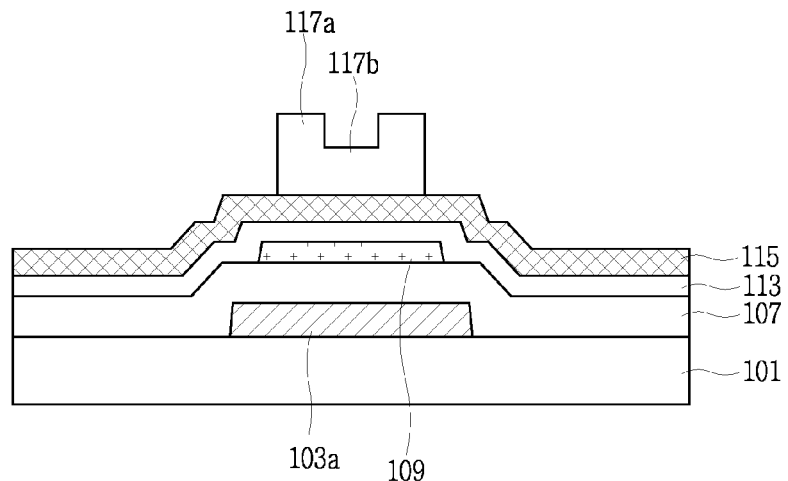

Thereafter, referring to FIG. 6E, the part of the third photosensitive layer 117 exposed to light during the exposure process is removed through a developing process to form third photosensitive layer patterns 117a and 117b having different thicknesses. Here, the thinner third photosensitive layer pattern 117b is positioned above a channel region of the active layer 109, and the thicker third photosensitive layer pattern 117a is positioned on a source alignment element and a drain alignment element to be formed in a follow-up process.

Figure 6F:
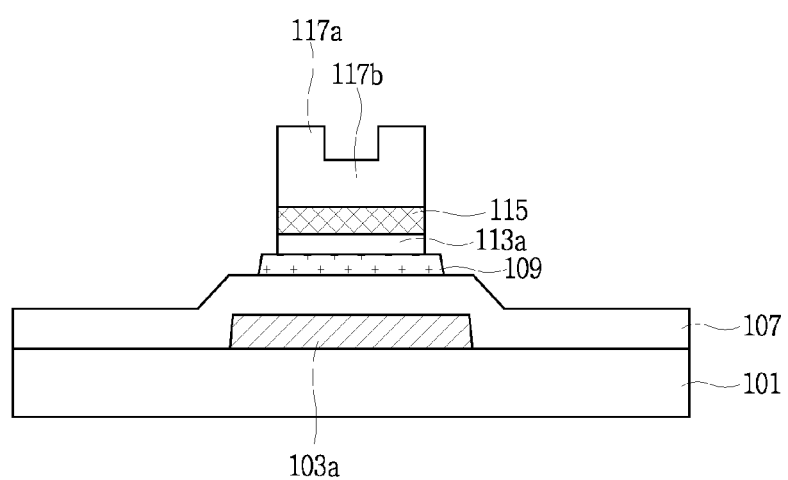

Subsequently, as illustrated in FIG. 6F, the second conductive layer 115 and the etch stop layer 113 are selectively etched by using the third photosensitive layer patterns 117a and 117b as an etch mask to form the etch stop layer pattern 113a. Here, the etch stop layer pattern 113a has an area smaller than that of the active layer 109, and a portion of the active layer 109 is exposed to the outside.

Figure 6G:
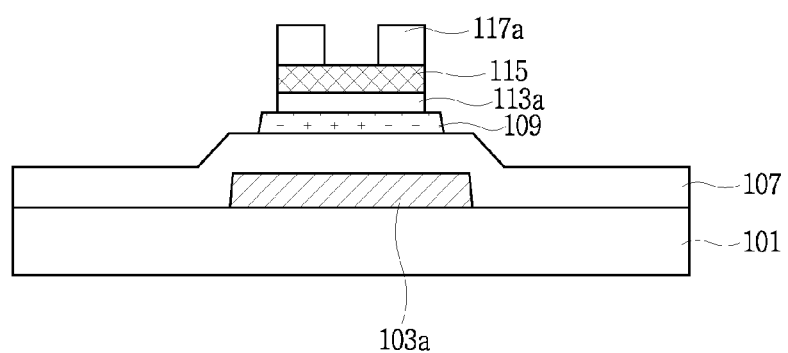

Thereafter, referring to FIG. 6G, an ashing process is performed to completely remove the third photosensitive layer pattern 117b among the third photosensitive layer patterns 117a and 117b. Here, portions of the third photosensitive layer pattern 117a are also removed together. Also, as the third photosensitive layer pattern 117b is completely removed, a portion of the lower second conductive layer 115 is exposed to the outside.

Figure 6H:
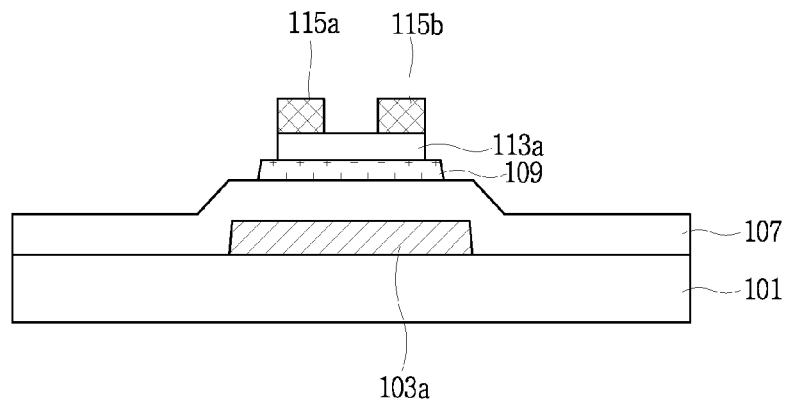

Subsequently, referring to FIG. 6H, the exposed portion of the second conductive layer 115 is etched by using the third photosensitive layer pattern 117a as an etch mask to form the source alignment element 115a and the drain alignment element 115b spaced apart from one another. Here, the source alignment element 115a and the drain alignment element 115b are entirely formed within the region of the etch stop layer pattern 113a. In other words, the entire source alignment element 115a and entire drain alignment element 115b are formed over and extend to but not past the boundaries of the etch stop layer pattern 113a. The source alignment element 115a and drain alignment element 115b are also entirely formed over the active layer 109 The source alignment element 115a and the drain alignment element 115b are also formed to be spaced apart from one another within the region of the etch stop layer pattern 113a. This is possible because the source alignment element 115a and the drain alignment element 115b are simultaneously formed with the etch stop layer pattern 113a during a single masking process using a half-tone mask in fabricating the oxide TFT.

Thus, since the first width W1 of one side of the etch stop layer pattern 113a overlapping with the source alignment element 115a and the second width W2 of the other side of the etch stop layer pattern 113a overlapping with the drain alignment element 115b are uniform, misalignment between the source alignment element 115a and the drain alignment element 115b and the etch stop layer pattern 113a can be prevented.

Thereafter, although not shown, a third conductive layer 123 is deposited on the entire surface of the substrate including the source alignment element 115a and the drain alignment element 115b through a sputtering deposition method, and a fourth photosensitive layer (not shown) is coated thereon. Here, the third conductive layer 123 may be made of a metal or any other appropriate material, like the gate electrode 103a. For example, the third conductive layer 123 may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide ($In_2O_3$), a combination of two or more of them, or any other appropriate material(s). Also, a material used to form the third conductive layer 123 may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Figure 6I:
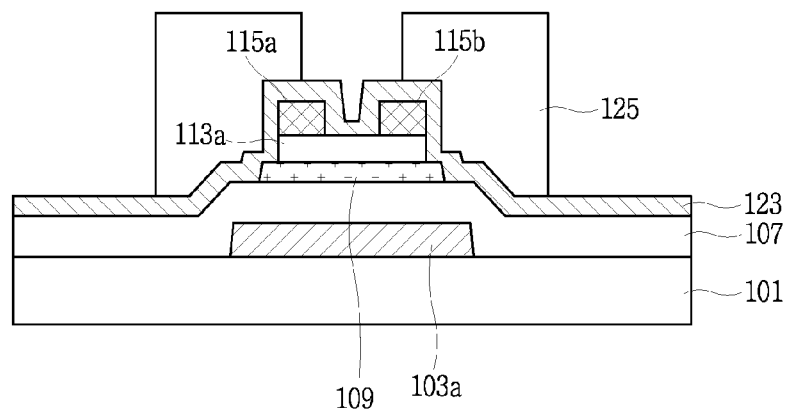

Subsequently, referring to FIG. 6I, the fourth photosensitive layer (not shown) is patterned through a fourth masking process using photolithography to form a fourth photosensitive layer pattern 125.

Figure 6J:
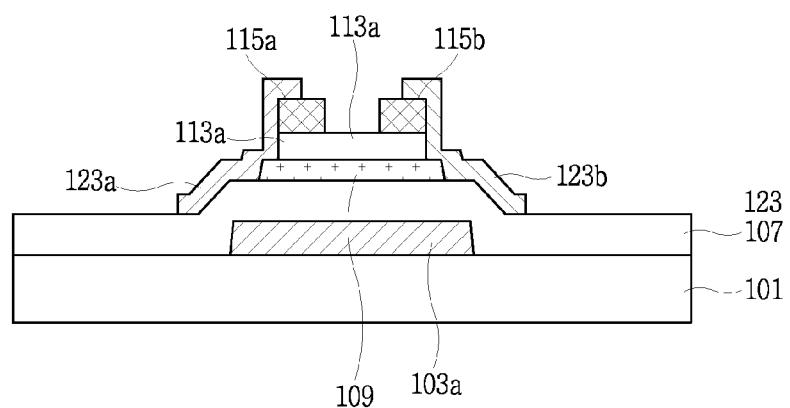

Thereafter, referring to FIG. 6J, the third conductive layer 123 is selectively etched by using the fourth photosensitive layer pattern 125 as an etch mask to simultaneously form the source electrode 123a in contact with the source alignment element 115a and the active layer 109 and the drain electrode 123b in contact with the drain alignment element 115b and the active layer 109, thus completing the fabrication process of the oxide TFT according to an embodiment of the present invention. Here, the source electrode 123a and the drain electrode 123b are formed to be in contact with exposed portions of the active layer 109 as well as upper portions of the source alignment element 115a and the drain alignment element 115b, whereby the channel is connected with the source electrode 123a and the drain electrode 123b, exhibiting the TFT characteristics.

As described above, according to an embodiment of the present invention, the source alignment element 115a, the drain alignment element 115b and the etch stop layer 113a can be simultaneously formed by using a half-tone mask in a single mask process step, eliminating misalignment of the source alignment element 115a and the drain alignment element 115b and the etch stop layer 113a.

Also, according to an embodiment of the present invention, since the source alignment element 115a, the drain alignment element 115b, and the etch stop layer 113a are simultaneously formed by using a half-tone mask in a single mask process step (as opposed to multiple mask steps), an alignment margin between the source alignment element 115a and the drain alignment element 115b and the etch stop layer 113a can be reduced, thereby resulting in smaller etch stop layer 113a and a shorter channel.

Also, according to an embodiment of the present invention, since the source alignment element 115a and the drain alignment element 11b and the etch stop layer 113a are simultaneously formed by using a half-tone mask, photo misalignment is eliminated, and thus, a difference in element characteristics due to a change in a process and element uniformity characteristics in the substrate 101 can be improved.

In addition, in the case of the oxide TFT, the method for fabricating the same, the array substrate for a display device having the same, and the method for fabricating the same according to embodiments of the present invention, since the source 115a and drain alignment elements 115b and the etch stop layer 113a are simultaneously formed by using a half-tone mask 121, the number of masks can be reduced to reduce fabrication cost.

Thus, in the oxide TFT and the method for fabricating the same according to embodiments of the present invention, since the active layer 109 is made of an oxide semiconductor including silicon, it has high electron mobility and a production unit cost is lowered. Also, since the process of fabricating the active layer 109 can be performed at room temperature, the process can be facilitated.

The oxide TFT structure according to an embodiment of the present invention may be applied as various electronic elements such as a driving element or a switching element of a flat panel display such as a liquid crystal display (LCD), an organic luminescence emitted diode (OLED), or the like, or an element for configuring a peripheral circuit of a memory device.

Hereinafter, an array substrate structure for an LCD having an oxide TFT according to another embodiment of the present invention will be described with reference to FIG. 7.

Figure 7:
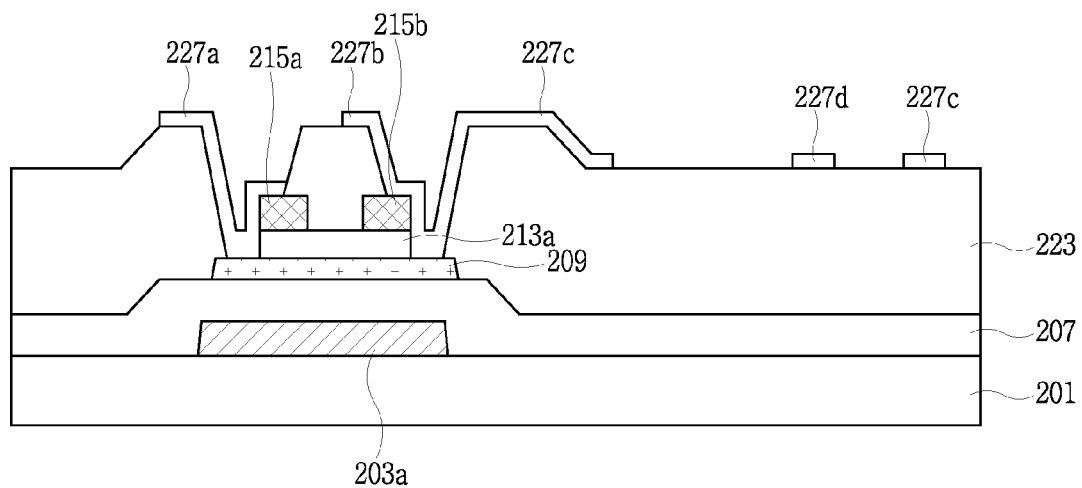
FIG. 7 is a schematic sectional view of an array substrate for a display device having an oxide TFT according to another embodiment of the present invention.

FIG. 7 is a schematic sectional view of an array substrate for a display device having an oxide TFT according to another embodiment of the present invention.

Here, an array substrate for a display device having an oxide TFT according to another embodiment of the present invention applied to an in-plane switching (IPS) mode LCD will be described as an example.

As illustrated in FIG. 7, an array substrate for a display device having an oxide TFT according to another embodiment of the present invention includes a gate electrode 203a formed on a substrate 201; a gate insulating layer 207 formed on the entire surface of the substrate 201 including the gate electrode 203a; an active layer 209 formed on the gate insulating layer 207 above the gate electrode 203a; an etch stop layer pattern 213a formed on the active layer 209; a source alignment element 215a and a drain alignment element 215b formed on the etch stop layer pattern 213a and spaced apart from one another; a passivation layer 223 formed on the entire surface of the substrate 201 including the source alignment element 215a and the drain alignment element 215b and having a source electrode contact hole (not shown) (refer to 225a in FIG. 8I) and a drain electrode contact hole (refer to 225b in FIG. 8I) exposing the active layer 209; a source electrode 227a formed on the passivation layer 223 and disposed to be in contact with the source alignment element 215a and the active layer 209 through the source electrode contact hole and a drain electrode 227b formed on the passivation layer 223 and disposed to be in contact with the drain alignment element 215b and the active layer 209 through the drain electrode contact hole; and a pixel electrode 227c formed on the passivation layer 223 and branched upon extending from the drain electrode 227b and a plurality of branched common electrodes 227d formed on the passivation layer 223 and spaced apart from the pixel electrode 227c.

Here, the gate electrode 203a may be made of silicon, glass, plastic, or any other appropriate material, or may be made of a metal or any other appropriate conductive material. For example, the gate electrode 203a may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide ($In_2O_3$), a combination of two or more of them, or any other appropriate material(s). Also, a material used to form the gate electrode 203a may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Also, the gate insulating layer 207 may be made of any one selected from the group consisting of silicon oxide ($SiO_2$), silicon nitride (SiNx), zirconium oxide ($ZrO_2$), hafnium oxide ($HfO_2$), titanium oxide ($TiO_2$), tantalum oxide ($Ta_2O_5$), a barium-strontium-titanium-oxygen compound (Ba—Sr—Ti—O), and a bismuth-zinc-niobium-oxygen compound (Bi—Zn—Nb—O), a combination of two or more of them, or any other appropriate material.

The active layer 209, a layer serving to form a channel allowing electrons to move therein between the source electrode 227a and the drain electrode 227b, is made of an oxide semiconductor including silicon (Si) instead of a low temperature polysilicon (LTPS) or an amorphous silicon (a-Si) material.

In this case, the oxide semiconductor may be obtained by adding silicon (Si) to an oxide semiconductor including one or more selected from the group consisting of germanium (Ge), tin (Sn), lead (Pb), indium (In), titanium (Ti), gallium (Ga), and aluminum (Al), and zinc (Zn). For example, the active pattern 109a may be made of silicon indium zinc oxide (Si—InZnO (SIZO)) obtained by adding silicon ions to a composite indium zinc oxide (InZnO).

When the active layer 209 is made of SIZO, a composition ratio of the content of silicon (Si) atoms to the entire content of zinc (Zn), indium (In), and silicon (Si) atoms in the active layer may ranging from about 0.001 wt % to about 30 wt %. As the content of the silicon (Si) atoms is increased, the role of controlling generation of electrons of the active layer 209 is strengthened to potentially lower mobility, but element stability may be better.

Meanwhile, besides the foregoing materials, the active layer 209 may further include a Group I element such as lithium (Li) or potassium (K), a Group II element such as magnesium (Mg), calcium (Ca), or strontium (Sr), a Group III element such as gallium (Ga), aluminum (Al), indium (In), or yttrium (Y), Group IV element such as titanium (Ti), zirconium (Zr), silicon (Si), tin (Sn), or geranium (Ge), a Group V element such as tantalum (Ta), vanadium (V), niobium (Nb), or antimony (Sb), or may further include lanthanides elements such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Also, the etch stop layer pattern 213a may be made of any one selected from inorganic insulating materials including silicon oxide ($SiO_2$) and silicon nitride (SiNx).

Also, the source alignment element 215a and the drain alignment element 215b may be made of a metal or any other conductive material, like the gate electrode 203a. For example, the source alignment element 215a and the drain alignment element 215b may be made of any one selected from the group consisting of indium tin oxide (ITO), gallium zinc oxide (GZO), indium gallium zinc oxide (IGZO), indium gallium oxide (IGO), indium zinc oxide (IZO), indium oxide ($In_2O_3$), a combination of two or more of them, or any other appropriate material(s). Also, a material used to form the source alignment element 215a and the drain alignment element 215b may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

In particular, the source alignment element 215a and the drain alignment element 215b are limitedly formed within the region of the etch stop layer pattern 213a, and the source alignment element 215a and the drain alignment element 215b are formed to be spaced apart from one another within the region of the etch stop layer pattern 213a. This is possible because the source alignment element 215a and the drain alignment element 215b are simultaneously formed with the etch stop layer pattern 213a during a masking process using a half-tone mask in fabricating the oxide TFT.

Thus, since the first width W1 of one side of the etch stop layer pattern 213a overlapping with the source alignment element 215a and the second width W2 of the other side of the etch stop layer pattern 213a overlapping with the drain alignment element 215b are substantially equal, misalignment between the source alignment element 215a and the drain alignment element 215b and the etch stop layer pattern 213a can be prevented.

The source electrode 227a and the drain electrode 227b are made of a transparent conductive material since the drain electrode 227b is extended to be used as a plurality of branched pixel electrodes 227c and the common electrode 227d. The pixel electrodes 227c and common electrode 227d may be branching, for example, to form the branched pixel structure of an IPS pixel. The transparent conductive material may be selected from the group consisting of ITO and IZO.

In particular, the source electrode 227a and the drain electrode 227b are formed to be in contact with an exposed portion of the active layer 209 as well as upper portions of the source alignment element 215a and the drain alignment element 215b, whereby a channel is connected with the source electrode 227a and the drain electrode 227b to exhibit TFT characteristics.

Hereinafter, a method for fabricating an array substrate for an LCD having an oxide TFT according to another embodiment of the present invention having the foregoing configuration as described above will be described in detail with reference to the accompanying drawings.

FIGS. 8A to 8K are sectional views illustrating a fabrication process of an array substrate for a display device having an oxide TFT according to another embodiment of the present invention.

Figure 8A:
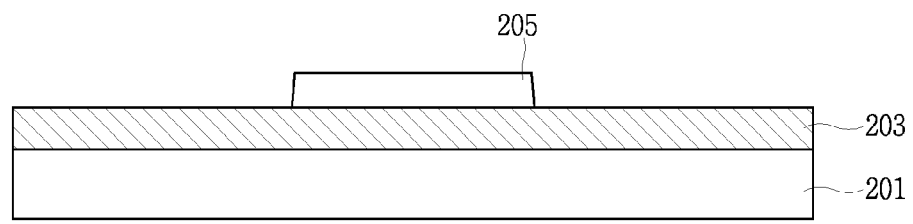
FIGS. 8A to 8K are sectional views illustrating a fabrication process of an array substrate for a display device having an oxide TFT according to another embodiment of the present invention.

Referring to FIG. 8A, a first conductive material for a gate electrode is deposited on the substrate 201 through a sputtering deposition method to form a first conductive layer 203, on which a first photosensitive layer (not shown) is coated and patterned through a first masking process using photolithography to form the first photosensitive layer pattern 205.

In this case, the first conductive layer 203 may be made of silicon, glass, plastic, or any other appropriate material, or may be made of a metal or any other appropriate conductive material. For example, the gate electrode 203a may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide ($In_2O_3$), a combination of two or more of them, or any other appropriate material(s). Also, a material used to form the first conductive layer 203 may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Figure 8B:
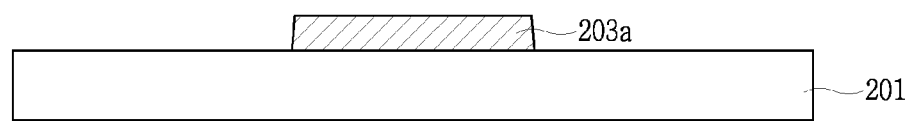

Thereafter, referring to FIG. 8B, the first conductive layer 203 is selectively etched by using the first photosensitive layer pattern 205 as an etch mask to form the gate electrode 203a.

Figure 8C:
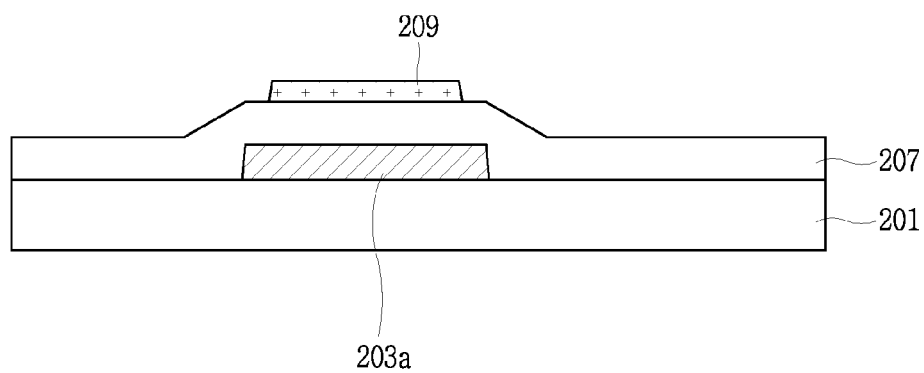

Subsequently, referring to FIG. 8C, the first photosensitive layer pattern 205 is removed, and the gate insulating layer 207 is formed on the entire surface of the substrate 201 including the gate electrode 203a. In this case, the gate insulating layer 207 may be made of any one selected from the group consisting of silicon oxide ($SiO_2$), silicon nitride (SiNx), zirconium oxide ($ZrO_2$), hafnium oxide ($HfO_2$), titanium oxide ($TiO_2$), tantalum oxide ($Ta_2O_5$), a barium-strontium-titanium-oxygen compound (Ba—Sr—Ti—O), and a bismuth-zinc-niobium-oxygen compound (Bi—Zn—Nb—O), a combination of two or more of them, or any other appropriate material.

Subsequently, a semiconductor layer (not shown) is formed by using an oxide semiconductor material on the gate insulating layer 207, and a second photosensitive layer (not shown) is coated thereon.

Thereafter, although not shown, the second photosensitive layer (not shown) is patterned through a second masking process using photolithography to form a second photosensitive layer pattern (not shown).

Subsequently, referring to FIG. 8C, the semiconductor layer (not shown) is selectively removed by using the second photosensitive layer pattern (not shown) as an etch mask to form the active layer 209 on the gate insulating layer 207 above the gate electrode 203a. Here, the active layer 209, serving to form a channel in which electrons move between the source electrode and the drain electrode, is made of an oxide semiconductor including silicon (Si) instead of LTPS or amorphous silicon (a-Si).

Here, the oxide semiconductor may be obtained by adding silicon (Si) to an oxide semiconductor including one or more selected from the group consisting of germanium (Ge), tin (Sn), lead (Pb), indium (In), titanium (Ti), gallium (Ga), and aluminum (Al), and zinc (Zn). For example, the active pattern 209a may be made of silicon indium zinc oxide (Si—InZnO (SIZO)) obtained by adding silicon ions to a composite indium zinc oxide (InZnO).

When the active layer 209 is made of SIZO, a composition ratio of the content of silicon (Si) atoms to the entire content of zinc (Zn), indium (In), and silicon (Si) atoms in the active layer may ranging from about 0.001 wt % to about 30 wt %. As the content of the silicon (Si) atoms is increased, the role of controlling generation of electrons of the active layer 209 is strengthened to potentially lower mobility, but element stability may be better.

Meanwhile, besides the foregoing materials, the active layer 209 may further include a Group I element such as lithium (Li) or potassium (K), a Group II element such as magnesium (Mg), calcium (Ca), or strontium (Sr), a Group III element such as gallium (Ga), aluminum (Al), indium (In), or yttrium (Y), Group IV element such as titanium (Ti), zirconium (Zr), silicon (Si), tin (Sn), or geranium (Ge), a Group V element such as tantalum (Ta), vanadium (V), niobium (Nb), or antimony (Sb), or may further include lanthanides elements such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Figure 8D:
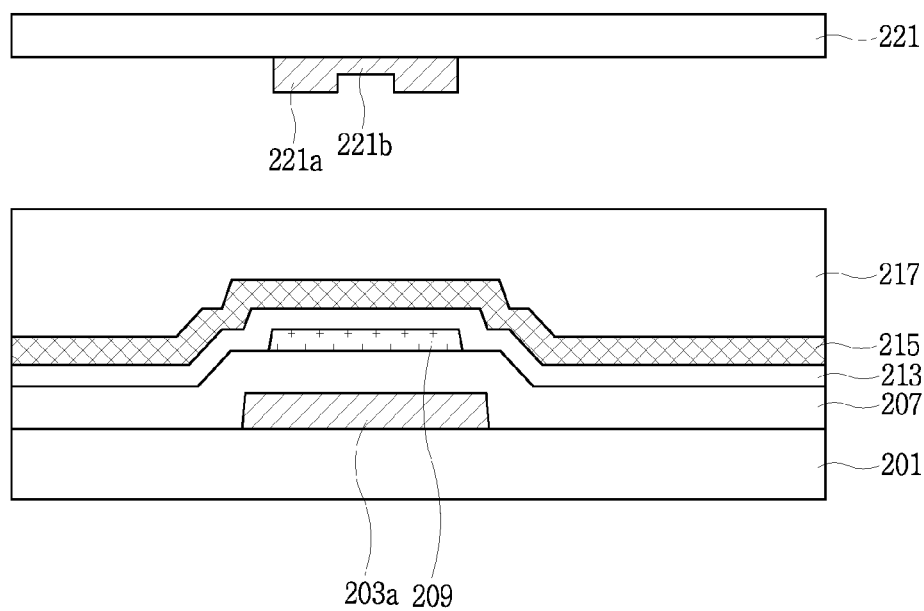

Thereafter, referring to FIG. 8D, etch stop layer 213 and the second conductive layer 215 are sequentially stacked on the entire surface of the substrate including the active layer 209, on which the third photosensitive layer 217 is coated. Here, the etch stop layer 213 may be made of any one selected from inorganic insulating materials including silicon oxide ($SiO_2$) and silicon nitride (SiNx).

Also, like the gate electrode 203a, the second conductive layer 215 may be made of a metal or any other appropriate conductive material. For example, the second conductive layer 215 may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide ($In_2O_3$), a combination of two or more of them, or any other appropriate material(s). Also, a material used to form the second conductive layer 215 may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Subsequently, an exposure process is performed through photolithograph using a half-tone mask 221. Here, the half-tone mask 221 includes a first light blocking pattern 221a and a second light blocking pattern 221b. The first light blocking pattern 221a serves to block entire light, and the second light blocking pattern 221b serves to allow a portion of light to be transmitted through while blocking the other remaining portion of light.

Figure 8E:
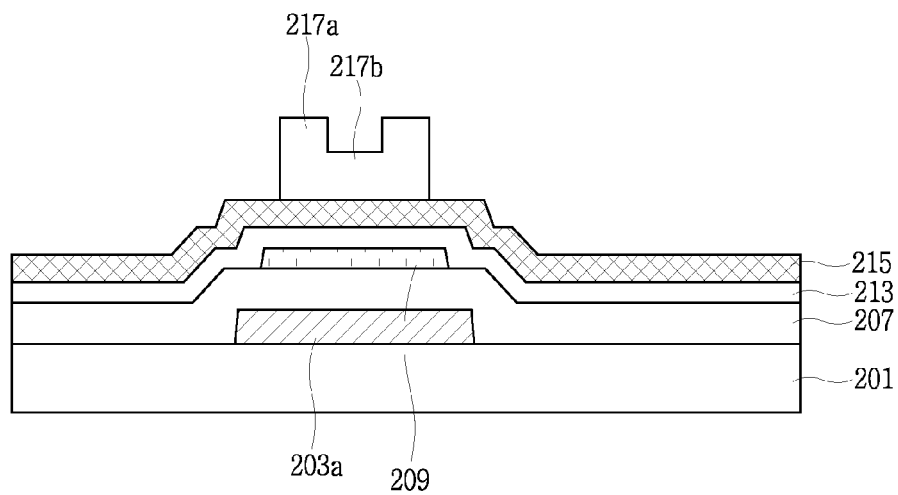

Thereafter, referring to FIG. 8E, the part of the third photosensitive layer 217 exposed to light during the exposure process is removed through a developing process to form third photosensitive layer patterns 217a and 217b having different thicknesses. Here, the thinner third photosensitive layer pattern 217b is positioned above a channel region of the active layer 209, and the thicker third photosensitive layer pattern 217a is positioned on a source alignment element and a drain alignment element to be formed in a follow-up process.

Figure 8F:
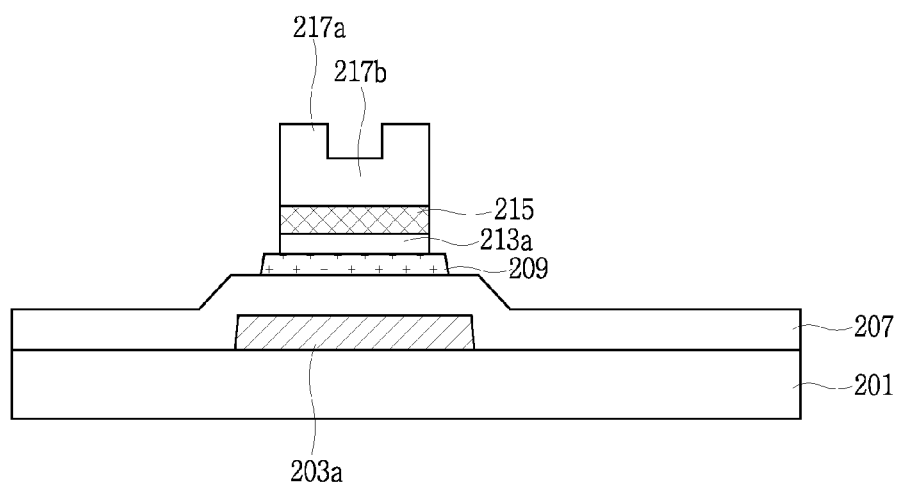

Subsequently, as illustrated in FIG. 8F, the second conductive layer 215 and the etch stop layer 213 are selectively etched by using the third photosensitive layer patterns 217a and 217b as an etch mask to form the etch stop layer pattern 213a. Here, the etch stop layer pattern 213a has an area smaller than that of the active layer 209, and a portion of the active layer 209 is exposed to the outside.

Figure 8G:
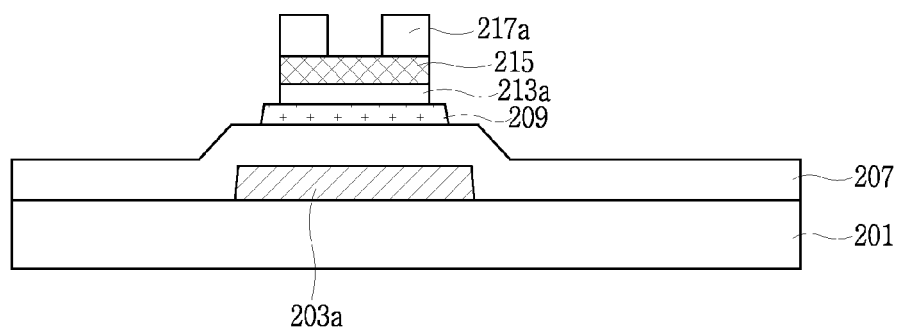

Thereafter, referring to FIG. 8G, an ashing process is performed to completely remove the third photosensitive layer pattern 217b among the third photosensitive layer patterns 217a and 217b. Here, portions of the third photosensitive layer pattern 217a are also removed together. Also, as the third photosensitive layer pattern 217b is completely removed, a portion of the lower second conductive layer 215 is exposed to the outside.

Figure 8H:
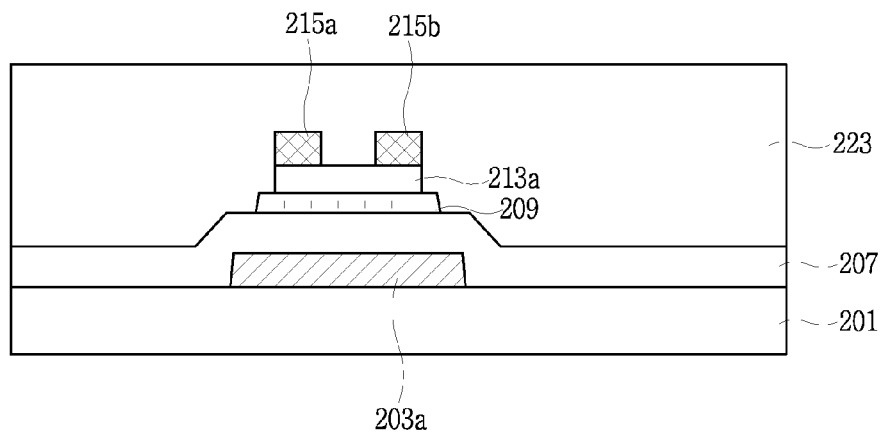

Subsequently, referring to FIG. 8H, the exposed portion of the second conductive layer 215 is etched by using the third photosensitive layer pattern 217a as an etch mask to form the source alignment element 215a and the drain alignment element 215b spaced apart from one another. Here, the source alignment element 215a and the drain alignment element 215b are limitedly formed within the region of the etch stop layer pattern 213a, and the source alignment element 215a and the drain alignment element 215b are formed to be spaced apart from one another within the region of the etch stop layer pattern 213a. This is possible because the source alignment element 215a and the drain alignment element 215b are simultaneously formed with the etch stop layer pattern 213a during a masking process using a half-tone mask in fabricating the oxide TFT. At this time, data wiring (not shown) is also formed when the source alignment element 215a and the drain alignment element 215b are formed.

Thus, since the first width W1 of one side of the etch stop layer pattern 213a overlapping with the source alignment element 215a and the second width W2 of the other side of the etch stop layer pattern 213a overlapping with the drain alignment element 215b are substantially equal, misalignment between the source alignment element 215a and the drain alignment element 215b and the etch stop layer pattern 213a is prevented.

Thereafter, although not shown, a fourth photosensitive layer (not shown) is coated on an upper portion of the passivation layer 223, and selectively patterned through a fourth masking processing using photolithography to form a fourth photosensitive layer pattern (not shown).

Figure 8I:
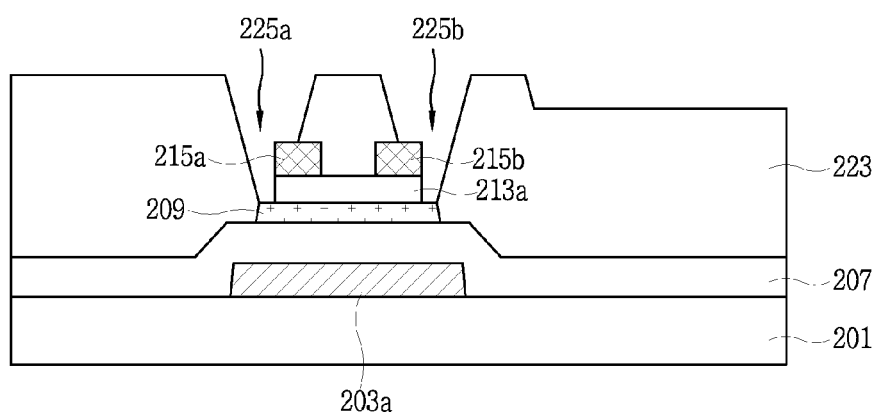

Thereafter, referring to FIG. 8I, the passivation layer 223 is selectively etched by using the fourth photosensitive layer pattern (not shown) as an etch mask to form the source electrode contact hole 225a and the drain electrode contact hole 225b exposing the source alignment element 215a, the drain alignment element 215b, and the active layer 209, respectively.

Figure 8J:
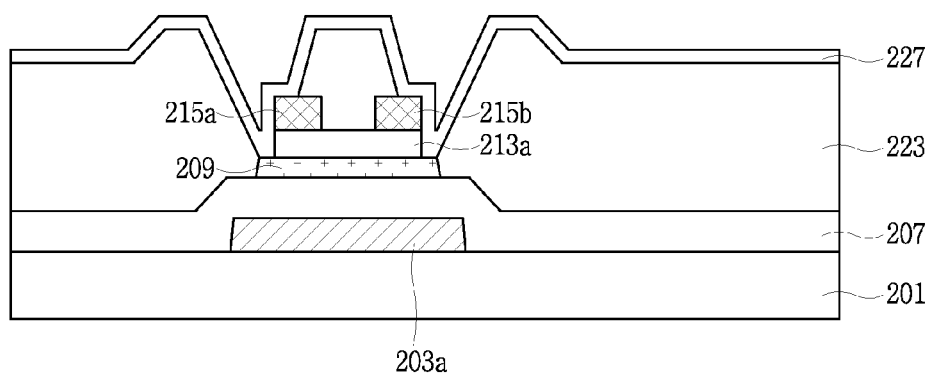

Subsequently, referring to FIG. 8J, the fourth photosensitive layer pattern (not shown) is removed, the third conductive layer 227 is deposited on an upper portion of the passivation layer 223 including the source electrode contact hole 225a and the drain electrode contact hole 225b through a sputtering deposition method, and a fifth photosensitive layer (not shown) is coated thereon. Here, the third conductive layer 227 is made of a transparent conductive material because it is used to form the plurality of branched pixel electrodes and common electrodes extending from the drain electrode as well as being used to form the source electrode and the drain electrode, and here, as the transparent conductive material, any one selected from the group consisting of transparent materials such as ITO and IZO may be used.

Thereafter, although not shown, the fifth photosensitive layer (not shown) is patterned through a fifth masking process using photolithography to form a fifth photosensitive layer pattern (not shown).

Figure 8K:
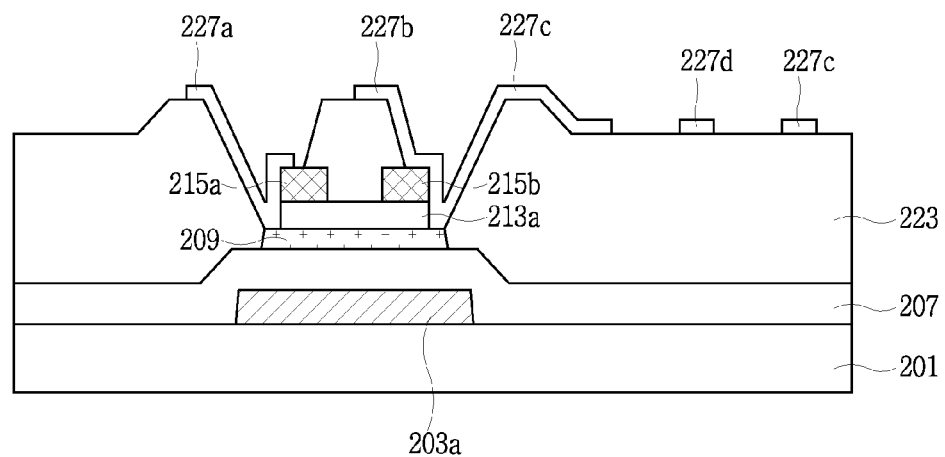

Subsequently, referring to FIG. 8K, the third conductive layer 227 is selectively etched by using the fifth photosensitive layer pattern (not shown) as an etch mask to form the source electrode 227a in contact with the source alignment element 215a and the active layer 209, the drain electrode 227b in contact with the drain alignment element 215b and the active layer 209, a plurality of branched pixel electrode 227c extending from the drain electrode 227b, and a plurality of branched common electrodes 227d spaced apart from the pixel electrodes 227c, thus completing the fabrication process of the array substrate for an LCD having an oxide TFT according to another embodiment of the present invention. Here, the source electrode 227a and the drain electrode 227b are formed to be in contact with an exposed portion of the active layer 209 as well as upper portions of the source alignment element 215a and the drain alignment element 215b, whereby a channel is connected with the source electrode 227a and the drain electrode 227b to exhibit TFT characteristics.

As described above, according to an embodiment of the present invention, the source alignment element 215a, the drain alignment element 215b, and the etch stop layer 213a can be simultaneously formed by using a half-tone mask 221, eliminating misalignment of the source alignment element 215a and the drain alignment element 215b and the etch stop layer 213a.

Also, according to an embodiment of the present invention, since the source alignment element 215a, the drain alignment element 215b, and the etch stop layer 213a are simultaneously formed by using a half-tone mask 221, an alignment margin between the source alignment element 215a and the drain alignment element 215b and the etch stop layer 213a can be reduced, resulting in a shorter etch stop layer 213a and a shorter channel.

Also, according to an embodiment of the present invention, since the source alignment element 215a and the drain alignment element 215b and the etch stop layer 213a are simultaneously formed by using a half-tone mask 221, photo misalignment is eliminated, and thus, a difference in element characteristics due to a change in a process and element uniformity characteristics in the substrate can be improved.

In addition, since the source alignment element 215a and drain alignment element 215b and the etch stop layer 213a are simultaneously formed by using a half-tone mask 221, the number of masks can be reduced to reduce fabrication cost.

Thus, in the array substrate for an LCD having an oxide TFT and the method for fabricating the same according to embodiments of the present invention, since the active layer 209 is made of an oxide semiconductor including silicon, it has high electron mobility and a production unit cost is lowered. Also, since the process of fabricating the active layer 209 can be performed at room temperature, the process can be facilitated.

The array substrate for an LCD having an oxide TFT according to an embodiment of the present invention may be may be applied as various electronic elements such as a driving element or a switching element of a flat panel display such as a liquid crystal display (LCD), an organic luminescence emitted diode (OLED), or the like, or an element for configuring a peripheral circuit of a memory device.

Hereinafter, a structure of an array substrate for an LCD having an oxide TFT according to still another embodiment of the present invention will be described with reference to FIG. 9.

Figure 9:
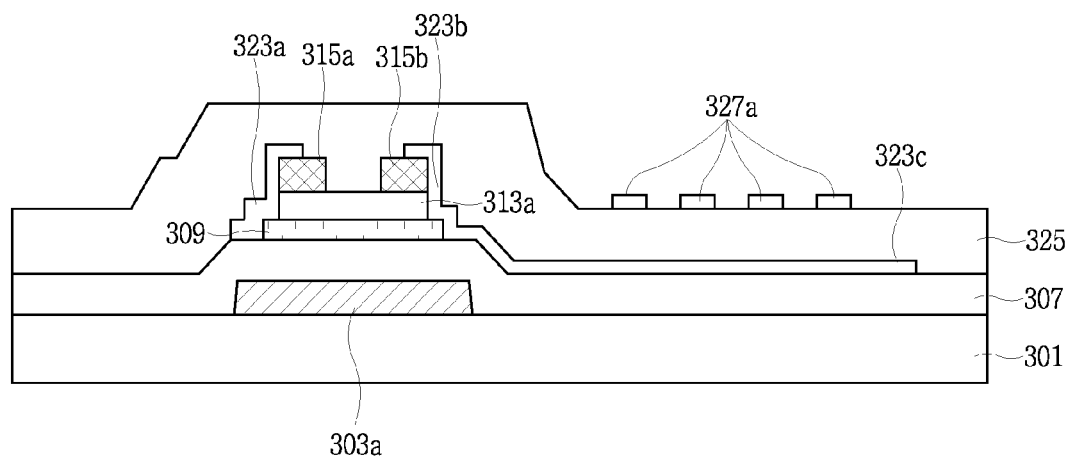
FIG. 9 is a schematic sectional view of the array substrate for a display device having an oxide TFT according to another embodiment of the present invention.

FIG. 9 is a schematic sectional view of the array substrate for a display device having an oxide TFT according to still another embodiment of the present invention.

Here, a structure of an array substrate for a display device having an oxide TFT according to still another embodiment of the present invention applied to a fringe field switching (FFS) mode LCD will be described as an example.

An array substrate for an LCD having a TFT according to still another embodiment of the present invention includes: a gate electrode 303a formed on a substrate 301; a gate insulating layer 307 formed on the entire surface of the substrate 301 including the gate electrode 303a; an active layer 309 formed on the gate insulating layer 307 above the gate electrode 303a; an etch stop layer 313a formed on the active layer 309; a source alignment element 315a and a drain alignment element 315b formed on the etch stop layer 313a and spaced apart from one another; a source electrode 323a in contact with the source alignment element 315a and the active layer 309 and a drain electrode 323b in contact with the drain alignment element 315b and the active layer 309; a large pixel electrode 323c extending from the drain electrode 323b; a passivation layer 325 formed on the entire surface of the substrate 301 including the source electrode 323a, the drain electrode 323b, and the pixel electrode 323c; and a plurality of common electrodes 327a formed on the passivation layer 325, spaced apart from each other, and corresponding to the pixel electrode 323c.

Here, the gate electrode 303a may be made of silicon, glass, plastic, or any other appropriate material, or may be made of a metal or any other appropriate conductive material. For example, the gate electrode 203a may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide ($In_2O_3$), a combination of two or more of them, or any other appropriate material(s). Also, a material used to form the gate electrode 303a may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Also, the gate insulating layer 307 may be made of any one selected from the group consisting of silicon oxide ($SiO_2$), silicon nitride (SiNx), zirconium oxide ($ZrO_2$), hafnium oxide ($HfO_2$), titanium oxide ($TiO_2$), tantalum oxide ($Ta_2O_5$), a barium-strontium-titanium-oxygen compound (Ba—Sr—Ti—O), and a bismuth-zinc-niobium-oxygen compound (Bi—Zn—Nb—O), a combination of two or more of them, or any other appropriate material.

The active layer 309, a layer serving to form a channel allowing electrons to move therein between the source electrode 323a and the drain electrode 323b, is made of an oxide semiconductor including silicon (Si) instead of a low temperature polysilicon (LTPS) or an amorphous silicon (a-Si) material.

In this case, the oxide semiconductor may be obtained by adding silicon (Si) to an oxide semiconductor including one or more selected from the group consisting of germanium (Ge), tin (Sn), lead (Pb), indium (In), titanium (Ti), gallium (Ga), and aluminum (Al), and zinc (Zn). For example, the active pattern 109a may be made of silicon indium zinc oxide (Si—InZnO (SIZO)) obtained by adding silicon ions to a composite indium zinc oxide (InZnO).

When the active layer 309 is made of SIZO, a composition ratio of the content of silicon (Si) atoms to the entire content of zinc (Zn), indium (In), and silicon (Si) atoms in the active layer may ranging from about 0.001 wt % to about 30 wt %. As the content of the silicon (Si) atoms is increased, the role of controlling generation of electrons of the active layer 309 is strengthened to potentially lower mobility, but element stability may be better.

Meanwhile, besides the foregoing materials, the active layer 309 may further include a Group I element such as lithium (Li) or potassium (K), a Group II element such as magnesium (Mg), calcium (Ca), or strontium (Sr), a Group III element such as gallium (Ga), aluminum (Al), indium (In), or yttrium (Y), Group IV element such as titanium (Ti), zirconium (Zr), silicon (Si), tin (Sn), or geranium (Ge), a Group V element such as tantalum (Ta), vanadium (V), niobium (Nb), or antimony (Sb), or may further include lanthanides elements such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Also, the etch stop layer pattern 313a may be made of any one selected from inorganic insulating materials including silicon oxide ($SiO_2$) and silicon nitride (SiNx).

Also, the source alignment element 315a and the drain alignment element 315b may be made of a metal or any other conductive material, like the gate electrode 303a. For example, the source alignment element 315a and the drain alignment element 315b may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide ($In_2O_3$), a combination of two or more of them, or any other appropriate material(s). Also, a material used to form the source alignment element 315a and the drain alignment element 315b may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

In particular, the source alignment element 315a and the drain alignment element 315b are limitedly formed within the region of the etch stop layer pattern 313a, and the source alignment element 315a and the drain alignment element 315b are formed to be spaced apart from one another within the region of the etch stop layer pattern 313a. This is possible because the source alignment element 315a and the drain alignment element 315b are simultaneously formed with the etch stop layer 313a during a masking process using a halftone mask in fabricating the oxide TFT.

Thus, since the first width W1 of one side of the etch stop layer pattern 313a overlapping with the source alignment element 315a and the second width W2 of the other side of the etch stop layer pattern 313a overlapping with the drain alignment element 315b are substantially equal, misalignment between the source alignment element 315a and the drain alignment element 315b and the etch stop layer pattern 313a can be prevented.

The source electrode 323a and the drain electrode 323b are made of a transparent conductive material because the drain electrode 323b extends to be used as the large pixel electrodes 323c. In this case, the transparent conductive material may include materials selected from the group consisting of ITO and IZO.

Also, the common electrode 327a is also made of a transparent conductive material that may include materials selected from the group consisting of ITO and IZO.

In particular, the source electrode 323a and the drain electrode 323b are formed to be in contact with an exposed portion of the active layer 309 as well as upper portions of the source alignment element 315a and the drain alignment element 315b, whereby a channel is connected with the source electrode 323a and the drain electrode 323b to exhibit TFT characteristics.

Hereinafter, a method for fabricating an array substrate for an LCD having an oxide TFT according to still another embodiment of the present invention having the foregoing configuration as described above will be described in detail with reference to the accompanying drawings.

FIGS. 10A to 10K are sectional views illustrating a fabrication process of an array substrate for a display device having an oxide TFT according to still another embodiment of the present invention.

Figure 10A:
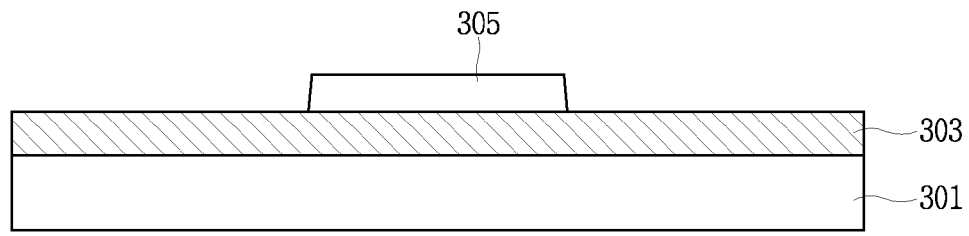
FIGS. 10A to 10K are sectional views illustrating a fabrication process of an array substrate for a display device having an oxide TFT according to another embodiment of the present invention.

Referring to FIG. 10A, a first conductive material for a gate electrode is deposited on the substrate 301 through a sputtering deposition method to form a first conductive layer 303, on which a first photosensitive layer (not shown) is coated and patterned through a first masking process using photolithography to form the first photosensitive layer pattern 305.

In this case, the first conductive layer 303 may be made of silicon, glass, plastic, or any other appropriate material, or may be made of a metal or any other appropriate conductive material. For example, the gate electrode 303a may be made of an oxide one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide ($In_2O_3$), a combination of two or more of them, or any other appropriate material(s). Also, a material used to form the first conductive layer 303 may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Figure 10B:
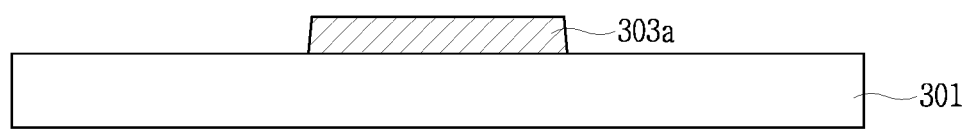

Thereafter, referring to FIG. 10B, the first conductive layer 303 is selectively etched by using the first photosensitive layer pattern 305 as an etch mask to form the gate electrode 303a.

Figure 10C:
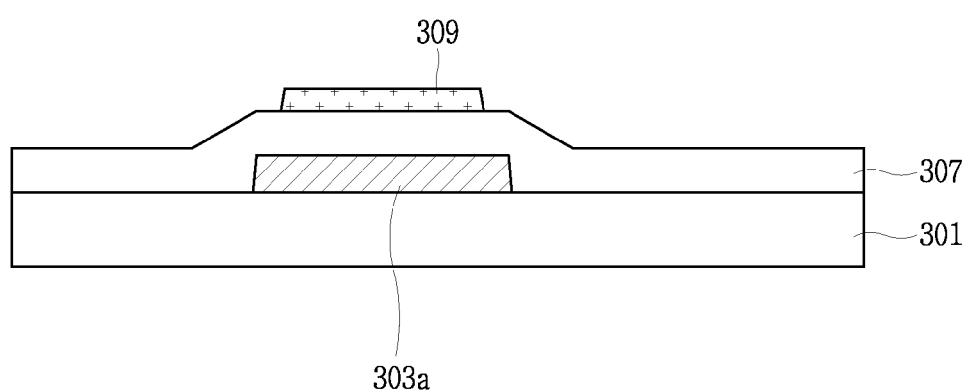

Subsequently, referring to FIG. 10C, the first photosensitive layer pattern 305 is removed, and the gate insulating layer 307 is formed on the entire surface of the substrate including the gate electrode 303a. In this case, the gate insulating layer 307 may be made of any one selected from the group consisting of silicon oxide ($SiO_2$), silicon nitride (SiNx), zirconium oxide ($ZrO_2$), hafnium oxide ($HfO_2$), titanium oxide ($TiO_2$), tantalum oxide ($Ta_2O_5$), a barium-strontium-titanium-oxygen compound (Ba—Sr—Ti—O), and a bismuth-zinc-niobium-oxygen compound (Bi—Zn—Nb—O), a combination of two or more of them, or any other appropriate material.

Subsequently, a semiconductor layer (not shown) is formed by using an oxide semiconductor material on the gate insulating layer 307, and a second photosensitive layer (not shown) is coated thereon.

Thereafter, although not shown, the second photosensitive layer (not shown) is patterned through a second masking process using photolithography to form a second photosensitive layer pattern (not shown).

Subsequently, referring to FIG. 10C, the semiconductor layer (not shown) is selectively removed by using the second photosensitive layer pattern (not shown) as an etch mask to form the active layer 309 on the gate insulating layer 307 above the gate electrode 203a. Here, the active layer 309, serving to form a channel in which electrons move between the source electrode and the drain electrode, is made of an oxide semiconductor including silicon (Si) instead of LTPS or amorphous silicon (a-Si).

Here, the oxide semiconductor may be obtained by adding silicon (Si) to an oxide semiconductor including one or more elements selected from the group consisting of germanium (Ge), tin (Sn), lead (Pb), indium (In), titanium (Ti), gallium (Ga), and aluminum (Al), and zinc (Zn). For example, the active pattern 209a may be made of silicon indium zinc oxide (Si—InZnO (SIZO)) obtained by adding silicon ions to a composite indium zinc oxide (InZnO).

When the active layer 309 is made of SIZO, a composition ratio of the content of silicon (Si) atoms to the entire content of zinc (Zn), indium (In), and silicon (Si) atoms in the active layer may ranging from about 0.001 wt % to about 30 wt %. As the content of the silicon (Si) atoms is increased, the role of controlling generation of electrons of the active layer 309 is strengthened to potentially lower mobility, but element stability may be better.

Meanwhile, besides the foregoing materials, the active layer 309 may further include a Group I element such as lithium (Li) or potassium (K), a Group II element such as magnesium (Mg), calcium (Ca), or strontium (Sr), a Group III element such as gallium (Ga), aluminum (Al), indium (In), or yttrium (Y), Group IV element such as titanium (Ti), zirconium (Zr), silicon (Si), tin (Sn), or geranium (Ge), a Group V element such as tantalum (Ta), vanadium (V), niobium (Nb), or antimony (Sb), or may further include lanthanides elements such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Figure 10D:
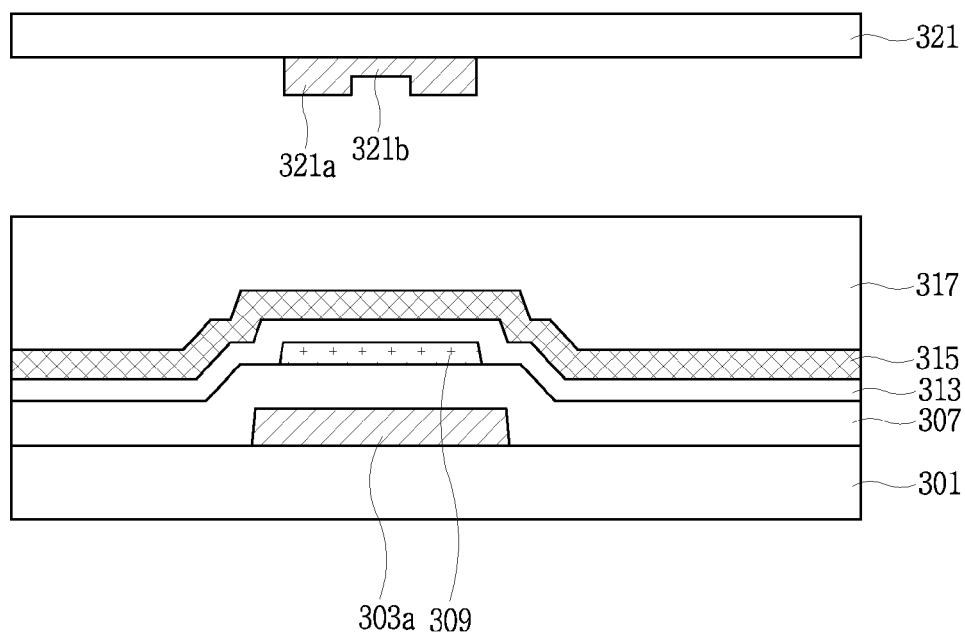

Thereafter, referring to FIG. 10D, etch stop layer 313 and the second conductive layer 315 are sequentially stacked on the entire surface of the substrate including the active layer 309, on which the third photosensitive layer 317 is coated. Here, the etch stop layer 313 may be made of any one selected from inorganic insulating materials including silicon oxide ($SiO_2$) and silicon nitride (SiNx).

Also, like the gate electrode 303a, the second conductive layer 315 may be made of a metal or any other appropriate conductive material. For example, the second conductive layer 315 may be made of any one selected from the group consisting of indium tin oxide (ITO), gallium zinc oxide (GZO), indium gallium zinc oxide (IGZO), indium gallium oxide (IGO), indium zinc oxide (IZO), indium zinc oxide (IZO), indium oxide ($In_2O_3$), a combination of two or more of them, or any other appropriate material(s). Also, a material used to form the second conductive layer 315 may include any one selected from a conductive metal group consisting of aluminum (Al), tungsten (W), copper (Cu), molybdenum (Mo), chromium (Cr), titanium (Ti), molybdenum tungsten (MoW), molybdenum titanium (MoTi), copper/molybdenum titanium (Cu/MoTi), a combination of two or more of them, or any other appropriate material.

Subsequently, an exposure process is performed through photolithograph using a half-tone mask 321. Here, the half-tone mask 321 includes a first light blocking pattern 321a and a second light blocking pattern 321b. The first light blocking pattern 321a serves to block entire light, and the second light blocking pattern 321b serves to allow a portion of light to be transmitted therethrough and block the other remaining portion of light.

Figure 10E:
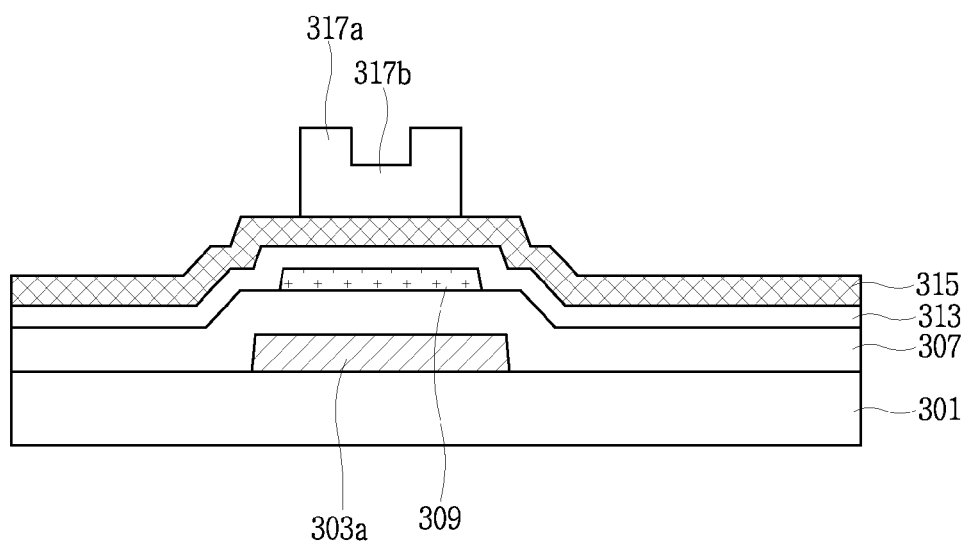

Thereafter, referring to FIG. 10E, The third photosensitive layer 317 part through which light was transmitted through the expose process is removed through a developing process to form third photosensitive layer patterns 317a and 317b having different thicknesses. Here, the thinner third photosensitive layer pattern 317b is positioned above a channel region of the active layer 309, and the thicker third photosensitive layer pattern 317a is positioned on a source alignment element and a drain alignment element to be formed in a follow-up process.

Figure 10F:
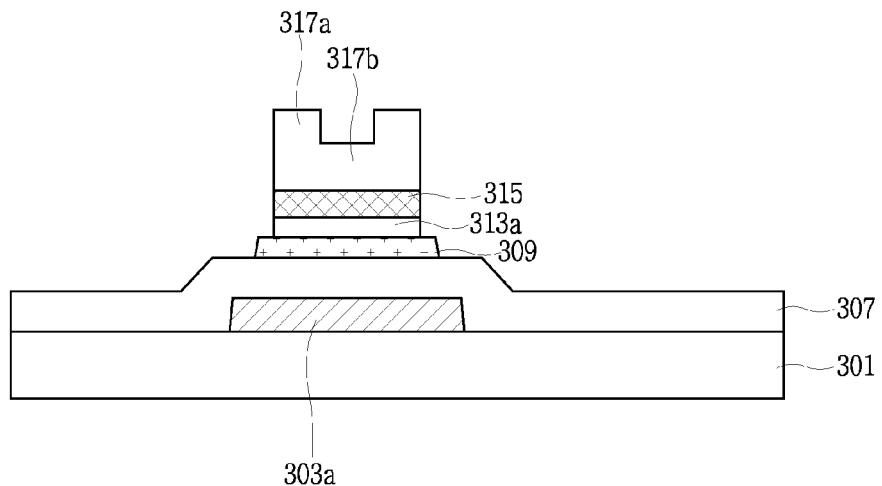

Subsequently, as illustrated in FIG. 10F, the second conductive layer 315 and the etch stop layer 313 are selectively etched by using the third photosensitive layer patterns 317a and 317b as an etch mask to form the etch stop layer pattern 313a. Here, the etch stop layer pattern 313a has an area smaller than that of the active layer 309, and a portion of the active layer 309 is exposed to the outside.

Figure 10G:
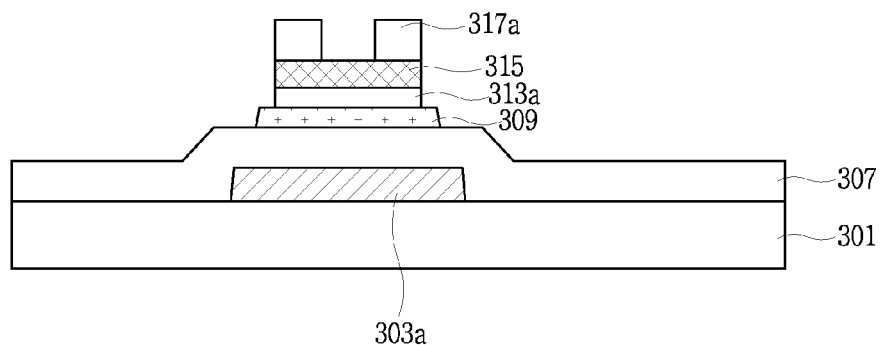

Thereafter, referring to FIG. 10G, an ashing process is performed to completely remove the third photosensitive layer pattern 317b among the third photosensitive layer patterns 317a and 317b. Here, portions of the third photosensitive layer pattern 317a are also removed together. Also, as the third photosensitive layer pattern 317b is completely removed, a portion of the lower second conductive layer 315 is exposed to the outside.

Figure 10H:
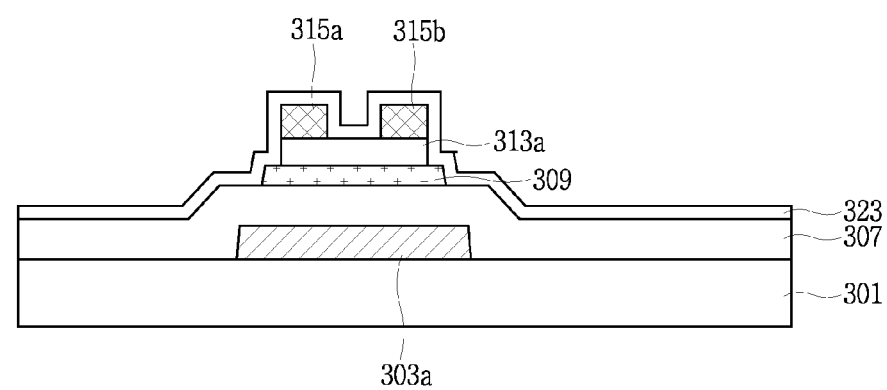

Subsequently, referring to FIG. 10H, the exposed portion of the second conductive layer 315 is etched by using the third photosensitive layer pattern 317a as an etch mask to form the source alignment element 315a and the drain alignment element 315b spaced apart from one another. Here, the source alignment element 315a and the drain alignment element 315b are limitedly formed within the region of the etch stop layer pattern 313a, and the source alignment element 315a and the drain alignment element 315b are formed to be spaced apart from one another within the region of the etch stop layer pattern 313a. This is possible because the source alignment element 315a and the drain alignment element 315b are simultaneously formed with the etch stop layer pattern 313a during a masking process using a half-tone mask in fabricating the oxide TFT. At this time, a data wiring (not shown) is also formed when the source alignment element 315a and the drain alignment element 315b are formed.

Thus, since the first width W1 of one side of the etch stop layer pattern 313a overlapping with the source alignment element 315a and the second width W2 of the other side of the etch stop layer pattern 313a overlapping with the drain alignment element 315b are substantially equal, misalignment between the source alignment element 215a and the drain alignment element 215b and the etch stop layer pattern 213a is prevented.

Thereafter, the third conductive layer 323 is deposited on the entire surface of the substrate 301 including the source alignment element 315a and the drain alignment element 315b, and a fourth photosensitive layer (not shown) is coated thereon. In this case, the third conductive layer 323 is made of a transparent conductive material because it is used as the large pixel electrode extending from the drain electrode. Here, as the transparent conductive material, any material selected from the group consisting of ITO and IZO is used.

Subsequently, although not shown, the fourth photosensitive layer (not shown) is selectively patterned through a fourth masking process using photolithography to form a fourth photosensitive layer pattern (not shown).

Figure 10I:
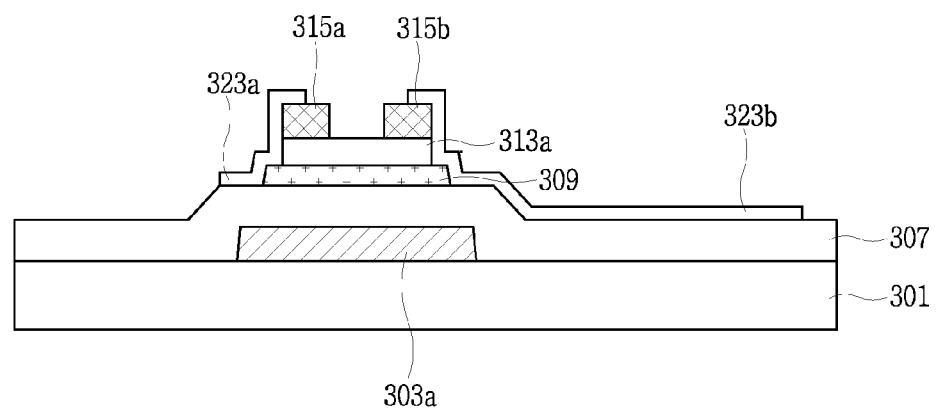

Thereafter, referring to FIG. 10I, the third conductive layer 323 is selectively etched by using the fourth photosensitive layer pattern (not shown) as an etch mask to form the source electrode 323a, the drain electrode 323b, and the large pixel electrode 323c extending from the drain electrode 323b. Here, the source electrode 323a and the drain electrode 323b are formed to be in contact with an exposed portion of the active layer 309 as well as upper portions of the source alignment element 315a and the drain alignment element 315b, whereby a channel is connected with the source electrode 323a and the drain electrode 323b to exhibit TFT characteristics.

Figure 10J:
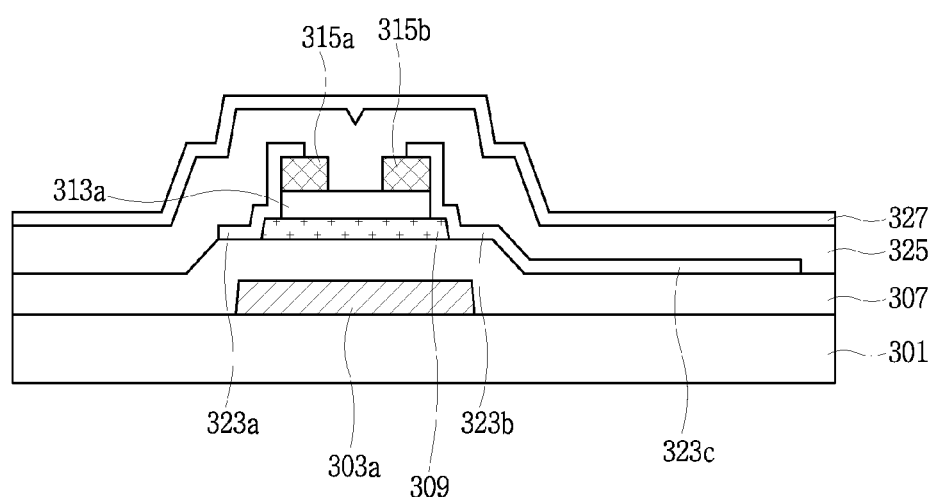

Subsequently, referring to FIG. 10J, the passivation layer 325 is deposited on the entire surface of the substrate 301 including the source electrode 323a, the drain electrode 323b, and the pixel electrode 323c. Here, the passivation layer 325 may be made of any one selected from among an inorganic insulating material and an organic insulating material.

Thereafter, the fourth conductive layer 327 is deposited on an upper portion of the passivation layer 325 through a sputtering deposition method, and a fifth photosensitive layer (not shown) is coated thereon. Here, the fourth conductive layer 327 is made of a transparent conductive material that may include materials selected from the group consisting of ITO and IZO.

Subsequently, although not shown, the fifth photosensitive layer (not shown) is patterned through a fifth masking process using photolithography to form a fifth photosensitive layer pattern (not shown).

Figure 10K:
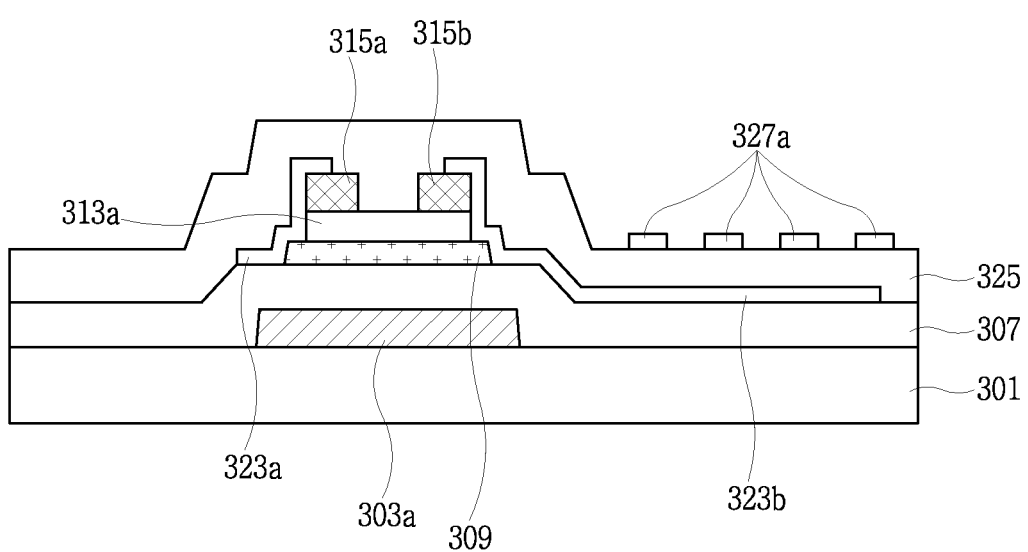

Subsequently, referring to FIG. 10K, the fourth conductive layer 327 is selectively etched by using the fifth photosensitive layer pattern (not shown) as an etch mask to form a plurality of branched common electrodes 327a corresponding to the pixel electrode 323c, thus completing the fabrication process of the array substrate for an LCD having an oxide TFT according to still another embodiment of the present invention.

As described above, according to an embodiment of the present invention, the source alignment element 315a, drain alignment element 315b, and the etch stop layer 313a can be simultaneously formed by using a half-tone mask 321 in a single mask process step, eliminating misalignment of the source alignment element 315a and the drain alignment element 315b and the etch stop layer 313a.

Also, according to an embodiment of the present invention, since the source alignment element 315a, the drain alignment element 315b, and the etch stop layer 313a are simultaneously formed by using a half-tone mask 321, an alignment margin between the source alignment element 315a and the drain alignment element 315b and the etch stop layer 313a can be reduced, thereby resulting in smaller etch stop layer 313a and a shorter channel Also, according to an embodiment of the present invention, since the source alignment element 315a and the drain alignment element 315b and the etch stop layer 313a are simultaneously formed by using a half-tone mask 321, photo misalignment is eliminated, and thus, a difference in element characteristics due to a change in a process and element uniformity characteristics in the substrate can be improved.

In addition, since the source alignment element 315a and drain alignment element 315b and the etch stop layer 313a are simultaneously formed by using a half-tone mask, the number of masks can be reduced to reduce fabrication cost.

Thus, in the array substrate for an LCD having an oxide TFT and the method for fabricating the same according to embodiments of the present invention, since the active layer is made of an oxide semiconductor including silicon, it has high electron mobility and a production unit cost is lowered. Also, since the process of fabricating the active layer can be performed at room temperature, the process can be facilitated.

The oxide TFT according to an embodiment of the present invention may be applied to fabricate an oxide TFT device that may replace an existing amorphous silicon TFT (a-Si TFT) or a polycrystalline silicon TFT (poly-Si TFT).

Also, the oxide TFT according to an embodiment of the present invention may be applied to a flat panel display, in particular, to an LCD or an OLED that requires a switching and driving element based on the TFT.

Finally, the oxide TFT according to an embodiment of the present invention may be applied to a flat panel display product, a cellular phone, a mobile device, a notebook computer, a monitor, a TV product, or the like, employing an LCD or an OLED.

Various matters have been specifically described but they should be construed as examples of preferred embodiments, rather than limiting the scope of the present invention. For example, a person skilled in the art to which the present invention pertains may diversity the components of the TFT according to the present invention and also modify a structure thereof.

Also, the TFT according to the present invention may also be applicable to a memory device or a logical device, as well as to an LCD or an OLED, and therefore, all changes and modifications that fall within the metes and bounds of the claims, or equivalents of such metes and bounds are therefore intended to be embraced by the appended claims.

What is claimed is:

1. An oxide thin film transistor (TFT) comprising:
    a gate electrode formed on a substrate;
    a gate insulating layer formed on the gate electrode;
    an active layer formed on the gate insulating layer above the gate electrode;
    an etch stop layer pattern formed on the active layer;
    a source alignment element and a drain alignment element entirely formed on the etch stop layer pattern, wherein the source alignment element is spaced apart from the drain alignment element, the source alignment element has a first side edge aligned with a first edge of the etch stop layer pattern, and the drain alignment element has a second side edge aligned with a second edge of the etch stop layer pattern;
    a source electrode in contact with the source alignment element and the active layer; and
    a drain electrode in contact with the drain alignment element and the active layer.

2. The oxide TFT of claim 1, wherein the etch stop layer pattern and the source alignment element and the drain alignment element are formed in a common masking process.

3. The oxide TFT of claim 1, wherein a first width in which the source alignment element and the etch stop layer pattern overlap with each other is substantially equal to a second width in which the drain alignment element and the etch stop layer pattern overlap with each other.

4. A method for fabricating an oxide thin film transistor (TFT), the method comprising:
    forming a gate electrode on a substrate;
    forming a gate insulating layer on the gate electrode;
    forming an active layer on the gate insulating layer above the gate electrode;
    forming an etch stop layer pattern, a source alignment element and a drain alignment element, wherein the etch stop layer pattern is located on the active layer, the source alignment element and drain alignment element are entirely located on the etch stop layer pattern, the source alignment element is spaced apart from the drain alignment element, the source alignment element has a first side edge aligned with a first edge of the etch stop layer pattern, and the drain alignment element has a second side edge aligned with a second edge of the etch stop layer pattern;
    forming a source electrode in contact with the source alignment element and the active layer; and
    forming a drain electrode in contact with the drain alignment element and the active layer.

5. The method of claim 4, wherein the etch stop layer pattern and the source alignment element and the drain alignment element are formed through a common masking process using a half-tone mask.

6. The method of claim 4, wherein a first width in which the source alignment element and the etch stop layer pattern overlap with each other is substantially equal to a second width in which the drain alignment element and the etch stop layer pattern overlap with each other.

7. An array substrate for a display device having thin film transistors (TFTs), the array substrate comprising:
    a gate electrode formed on a substrate;
    a gate insulating layer formed on the gate electrode;
    an active layer formed on the gate insulating layer above the gate electrode;
    an etch stop layer pattern formed on the active layer;
    a source alignment element and a drain alignment element entirely formed on the etch stop layer pattern, wherein the source alignment element is spaced apart from the drain alignment element, the source alignment element has a first side edge aligned with a first edge of the etch stop layer pattern, and the drain alignment element has a second side edge aligned with a second edge of the etch stop layer pattern;
    a passivation layer formed over the substrate on the source alignment element and the drain alignment element, the passivation layer having a source electrode contact hole and a drain electrode contact hole exposing the active layer;
    a source electrode formed on the passivation layer and in contact with the source alignment element and the active layer through the source electrode contact hole; and
    a drain electrode formed on the passivation layer and disposed in contact with the drain alignment element and the active layer through the drain electrode contact hole.

8. The array substrate of claim 7, further comprising:
    a plurality of branched pixel electrodes formed on the passivation layer and extending from the drain electrode; and
    a plurality of branched common electrodes formed on the passivation layer and spaced apart from the pixel electrodes.

9. The array substrate of claim 7, wherein the etch stop layer pattern and the source alignment element and the drain alignment element are formed in a common masking process.

10. The array substrate of claim 7, wherein a first width in which the source alignment element and the etch stop layer pattern overlap with each other is substantially equal to a second width in which the drain alignment element and the etch stop layer pattern overlap with each other.

11. A method for forming an array substrate for a display device having thin film transistors (TFTs), the method comprising:
    forming a gate electrode on a substrate;
    forming a gate insulating layer on the entire surface of the substrate including the gate electrode;
    forming an active layer on the gate insulating layer above the gate electrode;
    forming an etch stop layer pattern, a source alignment element and a drain alignment element, wherein the etch stop layer pattern is formed on the active layer, the source alignment element and drain alignment element are entirely formed on the etch stop layer pattern, the source alignment element is spaced apart from the drain alignment element, the source alignment element has a first side edge aligned with a first edge of the etch stop layer pattern, and the drain alignment element has a second side edge aligned with a second edge of the etch stop layer pattern;
    forming a passivation layer on the source alignment element and the drain alignment element, the passivation layer having a source electrode contact hole and a drain electrode contact hole exposing the active layer;
    forming a source electrode in contact with the source alignment element and the active layer through the source electrode contact hole; and
    forming a drain electrode in contact with the drain alignment element and the active layer through the drain electrode contact hole.

12. The method of claim 11, further comprising:
    forming a plurality of branched pixel electrodes extending from the drain electrode; and forming a plurality of common electrodes spaced apart from the pixel electrodes.

13. The method of claim 11, wherein the etch stop layer pattern, the source alignment element and the drain alignment element are formed through a common masking process using a half-tone mask.

14. The method of claim 11, wherein a first width in which the source alignment element and the etch stop layer pattern overlap with each other is substantially equal to a second width in which the drain alignment element and the etch stop layer pattern overlap with each other.

15. An array substrate for a display device having thin film transistors (TFTs), the array substrate comprising:
   a gate electrode formed on a substrate;
   a gate insulating layer formed on the gate electrode;
   an active layer formed on the gate insulating layer above the gate electrode;
   an etch stop layer pattern formed on the active layer;
   a source alignment element and a drain alignment element entirely formed on the etch stop layer pattern, wherein the source alignment element is spaced apart from the drain alignment element, the source alignment element has a first side edge aligned with a first edge of the etch stop layer pattern, and the drain alignment element has a second side edge aligned with a second edge of the etch stop layer pattern;
   a source electrode in contact with the source alignment element and the active layer;
   a drain electrode in contact with the drain alignment element and the active layer; and
   a pixel electrode extending from the drain electrode.

16. The array substrate of claim 15, further comprising:
   a passivation layer formed on the source electrode, the drain electrode, and the pixel electrode; and
   a plurality of branched common electrodes formed on the passivation layer and corresponding to the pixel electrode extending from the drain electrode.

17. The array substrate of claim 15, wherein the etch stop layer pattern, the source alignment element and the drain alignment element are formed through a common masking process.

18. The array substrate of claim 15, wherein a first width in which the source alignment element and the etch stop layer pattern overlap with each other is substantially equal to a second width in which the drain alignment element and the etch stop layer pattern overlap with each other.

19. A method for forming an array substrate for a display device having thin film transistors (TFTs), the method comprising:
   forming a gate electrode on a substrate;
   forming a gate insulating layer on the gate electrode;
   forming an active layer on the gate insulating layer above the gate electrode;
   forming an etch stop layer pattern, a source alignment element and a drain alignment element, wherein the etch stop layer pattern is located on the active layer, the source alignment element and drain alignment element are entirely located on the etch stop layer pattern, the source alignment element is spaced apart from the drain alignment element, the source alignment element has a first side edge aligned with a first edge of the etch stop layer pattern, and the drain alignment element has a second side edge aligned with a second edge of the etch stop layer pattern;
   forming a source electrode in contact with the source alignment element and the active layer;
   forming a drain electrode in contact with the drain alignment element and the active layer; and
   forming a pixel electrode extending from the drain electrode.

20. The method of claim 19, further comprising:
   forming a passivation layer on the source electrode, the drain electrode, and the pixel electrode; and
   forming a plurality of branched common electrodes on the passivation layer and corresponding to the pixel electrode extending from the drain electrode.

21. The method of claim 19, wherein the etch stop layer pattern, the source alignment element and the drain alignment element are formed through a common masking process using a half-tone mask.

22. The method of claim 19, wherein a first width in which the source alignment element and the etch stop layer pattern overlap with each other is substantially equal to a second width in which the drain alignment element and the etch stop layer pattern overlap with each other.

* * * * *